(12) United States Patent
Kao et al.

(10) Patent No.: US 12,148,652 B2
(45) Date of Patent: *Nov. 19, 2024

(54) SILICON OXIDE LAYER FOR OXIDATION RESISTANCE AND METHOD FORMING SAME

(71) Applicant: Taiwan Semiconductor Manufacturing Co., Ltd., Hsinchu (TW)

(72) Inventors: Wan-Yi Kao, Baoshan Township (TW); Chung-Chi Ko, Nantou (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,921

(22) Filed: Jun. 30, 2022

(65) Prior Publication Data

US 2022/0336264 A1 Oct. 20, 2022

Related U.S. Application Data

(63) Continuation of application No. 16/528,875, filed on Aug. 1, 2019, now Pat. No. 11,393,711.

(Continued)

(51) Int. Cl.
*H01L 21/762* (2006.01)
*H01L 21/02* (2006.01)
*H01L 27/088* (2006.01)

(52) U.S. Cl.
CPC .. *H01L 21/76224* (2013.01); *H01L 21/02126* (2013.01); *H01L 21/0228* (2013.01);

(Continued)

(58) Field of Classification Search
CPC ............. H01L 27/0886; H01L 29/785; H01L 29/66795; H01L 21/02126; H01L 21/0217;

(Continued)

(56) References Cited

U.S. PATENT DOCUMENTS 6,413,583 B1 7/2002 Moghadam et al.
7,077,904 B2 7/2006 Cho et al.
(Continued)

FOREIGN PATENT DOCUMENTS

KR 100468729 B1 1/2005
KR 20100109884 A 10/2010
KR 20180068844 A 6/2018

*Primary Examiner* — Victor A Mandala
*Assistant Examiner* — Lawrence C Tynes, Jr.
(74) *Attorney, Agent, or Firm* — Slater Matsil, LLP

(57) ABSTRACT

An integrated circuit structure includes a bulk semiconductor region, a first semiconductor strip over and connected to the bulk semiconductor region, and a dielectric layer including silicon oxide therein. Carbon atoms are doped in the silicon oxide. The dielectric layer includes a horizontal portion over and contacting a top surface of the bulk semiconductor region, and a vertical portion connected to an end of the horizontal portion. The vertical portion contacts a sidewall of a lower portion of the first semiconductor strip. A top portion of the first semiconductor strip protrudes higher than a top surface of the vertical portion to form a semiconductor fin. The horizontal portion and the vertical portion have a same thickness. A gate stack extends on a sidewall and a top surface of the semiconductor fin.

20 Claims, 33 Drawing Sheets

Related U.S. Application Data

(60) Provisional application No. 62/770,429, filed on Nov. 21, 2018.

(52) U.S. Cl.
 CPC .. *H01L 21/02337* (2013.01); *H01L 21/02343* (2013.01); *H01L 27/0886* (2013.01); *H01L 21/0217* (2013.01)

(58) Field of Classification Search
 CPC ......... H01L 21/0228; H01L 21/823431; H01L 21/02343
 See application file for complete search history.

(56) References Cited

U.S. PATENT DOCUMENTS

| | | |
|---|---|---|
| 9,887,094 B1 | 2/2018 | Qi et al. |
| 10,867,841 B2 | 12/2020 | Hsiao et al. |
| 11,393,711 B2 * | 7/2022 | Kao ................... H01L 21/76224 |
| 2003/0015764 A1 * | 1/2003 | Raaijmakers ....... H01L 21/3141 |
| | | 257/424 |
| 2008/0179715 A1 | 7/2008 | Coppa |
| 2011/0065287 A1 | 3/2011 | Wajda |
| 2013/0092984 A1 | 4/2013 | Liu et al. |
| 2013/0237064 A1 * | 9/2013 | Kirikihira ............. C23C 16/455 |
| | | 438/758 |
| 2015/0004772 A1 * | 1/2015 | Tsai ................... H01L 21/76224 |
| | | 438/424 |
| 2015/0179503 A1 | 6/2015 | Tsai et al. |
| 2015/0228534 A1 | 8/2015 | Wu et al. |
| 2015/0311200 A1 | 10/2015 | Yin et al. |
| 2017/0033199 A1 | 2/2017 | Wu et al. |
| 2017/0077094 A1 | 3/2017 | Tsao |
| 2018/0061628 A1 * | 3/2018 | Ou ...................... H01L 21/3065 |
| 2018/0197987 A1 * | 7/2018 | Zhou ................. H01L 29/66545 |
| 2018/0211866 A1 * | 7/2018 | Cheng ............ H01L 21/823431 |
| 2018/0247935 A1 | 8/2018 | Hsu et al. |
| 2020/0105583 A1 * | 4/2020 | Wang .................. H01L 27/0924 |

* cited by examiner

SILICON OXIDE LAYER FOR OXIDATION RESISTANCE AND METHOD FORMING SAME

PRIORITY CLAIM AND CROSS-REFERENCE

This application is a continuation of U.S. patent application Ser. No. 16/528,875, entitled "Silicon Oxide Layer for Oxidation Resistance and Method Forming Same," filed Aug. 1, 2019, which claims the benefit of the U.S. Provisional Application No. 62/770,429, filed Nov. 21, 2018, and entitled "Silicon Oxide Film with Good Oxidation Resistance and Method Forming Same," which applications are hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions and the respective FinFETs, STI regions are first formed, and then recessed to form semiconductor fins, based on which the FinFETs are formed. The formation of STI regions may include forming an isolation liner, and then forming an oxide region over the isolation liner using flowable chemical vapor deposition.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
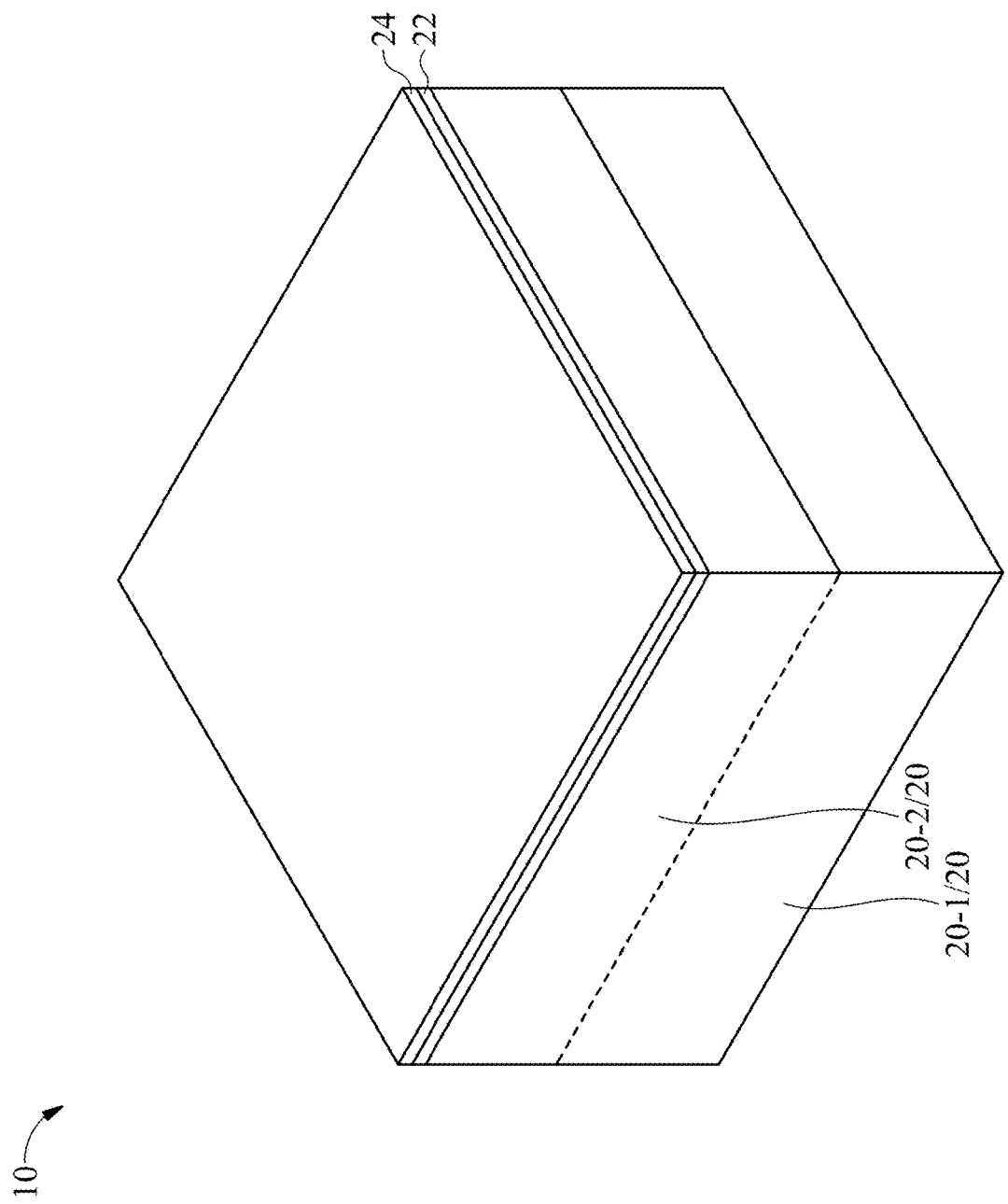
FIGS. 1, 2, 3A, 3B, 4, 5A, 5B, 6A, 6B, 6C, 7-12, 13A, 13B, and 13C are perspective views and cross-sectional views of intermediate stages in the formation of Shallow Trench Isolation (STI) regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Shallow Trench Isolation (STI) regions, Fin Field-Effect Transistors (FinFETs), and the methods of forming the same are provided. The intermediate stages in the formation of the STI regions and the FinFETs are illustrated in accordance with some embodiments. Some variations of some embodiments are discussed. Throughout the various views and illustrative embodiments, like reference numbers are used to designate like elements. In accordance with some embodiments of the present disclosure, the formation of STI regions includes forming SiOCN films (which may be SiOCNH films), and then performing anneal processes to convert the SiOCN films to silicon oxide layers. The SiOCN films and the resulting silicon oxide layers have good oxidation resistance, and may protect the semiconductor strips between the STI regions from being oxidized. The concept of the discussed embodiments may also be applied to the structure and the processing of other structures including, and not limited to, any other gap-filling processes in which silicon oxide is to be filled, and any other processes in which a silicon oxide layer may be formed. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components.

Although method embodiments may be discussed as being performed in a particular order, other method embodiments may be performed in any logical order.

FIGS. 1, 2, 3A, 3B, 4, 5A, 5B, 6A, 6B, 6C, 7-12, 13A, 13B, and 13C illustrate the perspective views and cross-sectional views of intermediate stages in the formation of STI regions and parts of a FinFET in accordance with some embodiments of the present disclosure. The corresponding processes are also reflected schematically in the process flow 200 shown in FIG. 30.

FIG. 1 illustrates a perspective view of an initial structure. The initial structure includes wafer 10, which includes substrate 20. Substrate 20 may further include substrate (portion) 20-1. Substrate 20-1 may be a semiconductor substrate, which may be a silicon substrate, a silicon germanium substrate, or a substrate formed of other semiconductor materials. Substrate 20-1 may also be a bulk substrate or a semiconductor-on-insulator substrate.

Figure 30:
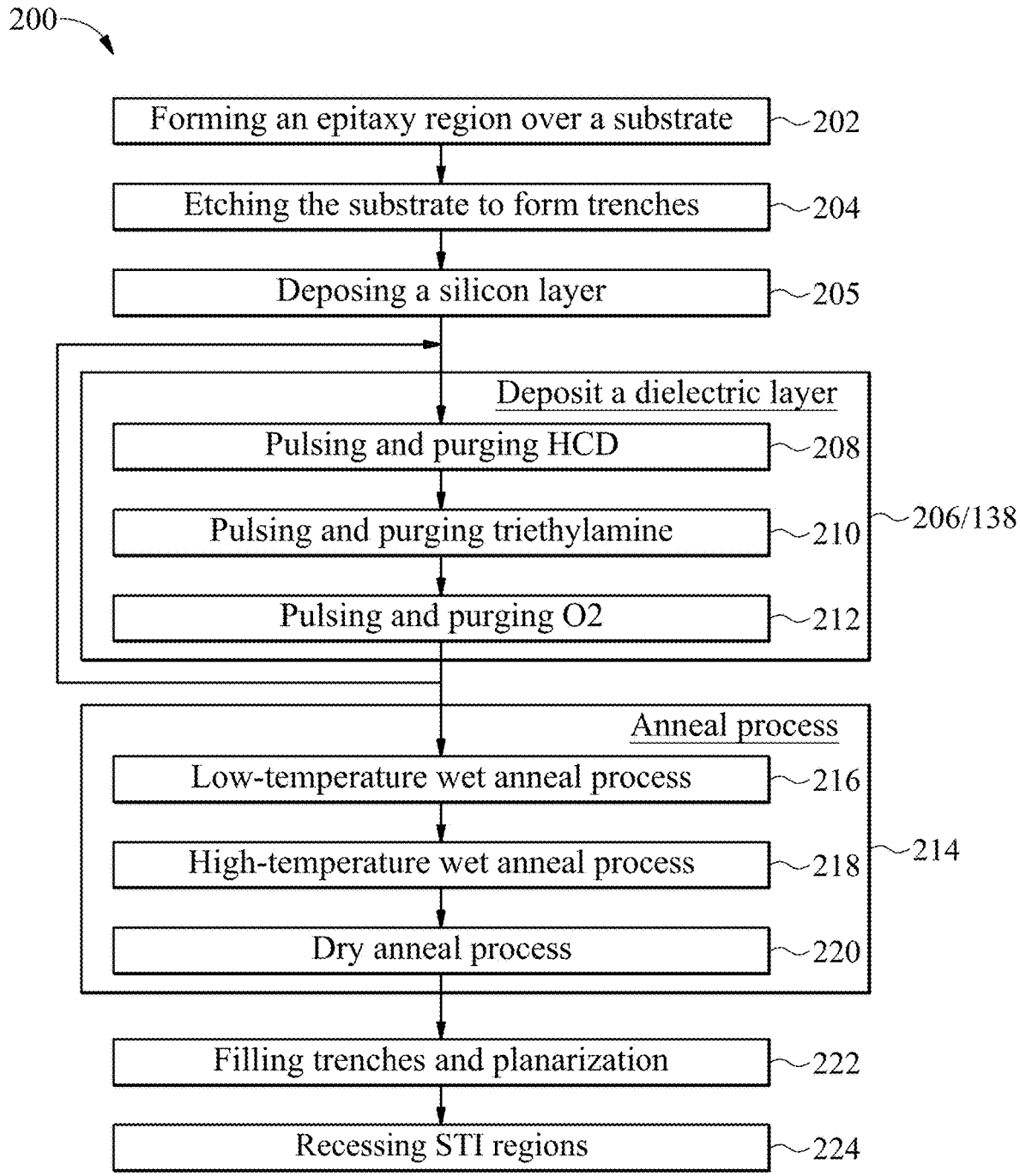
FIG. 30 illustrates a process flow for forming STI regions and a FinFET in accordance with some embodiments.

In accordance with some embodiments of the present disclosure, the illustrated region is a p-type device region, in which a p-type transistor such as a p-type Fin Field-Effect Transistor (FinFET) is to be formed. Epitaxy semiconductor layer 20-2 may be epitaxially grown on top of substrate 20-1. The respective process is illustrated as process 202 in the process flow 200 as shown in FIG. 30. Throughout the description, epitaxy semiconductor layer 20-2 and substrate 20-1 are collectively referred to as substrate 20. Epitaxy semiconductor layer 20-2 may be formed of silicon germanium (SiGe) or germanium (without silicon therein). The germanium atomic percentage in epitaxy semiconductor layer 20-2 may be higher than the germanium atomic percentage (if any) in substrate portion 20-1. In accordance with some embodiments of the present disclosure, the atomic percentage in epitaxy semiconductor layer 20-2 (when formed of SiGe) is in the range between about 30 percent and 100 percent. Epitaxy semiconductor layer 20-2 may also be formed of, or include a layer formed of, SiP, SiC, SiPC, SiGeB, or a III-V compound semiconductor such as InP, GaAs, AlAs, InAs, InAlAs, InGaAs, or the like. Epitaxy semiconductor layer 20-2 may also be substantially free from silicon, for example, with a silicon percentage lower than about 1 percent.

In accordance with some embodiments of the present disclosure, the illustrated device region is a p-type device region, in which a p-type transistor such as a p-type FinFET is to be formed. Accordingly, epitaxy semiconductor layer 20-2 may be formed. On the same wafer and in the same device die, n-type FinFETs may be formed, and the respective device region for forming the n-type FinFETs may not have the epitaxy layer 20-2 formed therein.

Pad layer 22 and mask layer 24 may be formed on semiconductor substrate 20. Pad layer 22 may be a thin film formed of silicon oxide. In accordance with some embodiments of the present disclosure, pad oxide layer 22 is formed in a thermal oxidation process, wherein a top surface layer of semiconductor substrate 20 is oxidized. Pad layer 22 acts as an adhesion layer between semiconductor substrate 20 and mask layer 24. Pad layer 22 may also act as an etch stop layer for etching mask layer 24. In accordance with some embodiments of the present disclosure, mask layer 24 is formed of silicon nitride, for example, using Low-Pressure Chemical Vapor Deposition (LPCVD). In accordance with other embodiments of the present disclosure, mask layer 24 is formed through Plasma Enhanced Chemical Vapor Deposition (PECVD) or the like methods. Mask layer 24 is used as a hard mask during subsequent photolithography processes.

Figure 2:
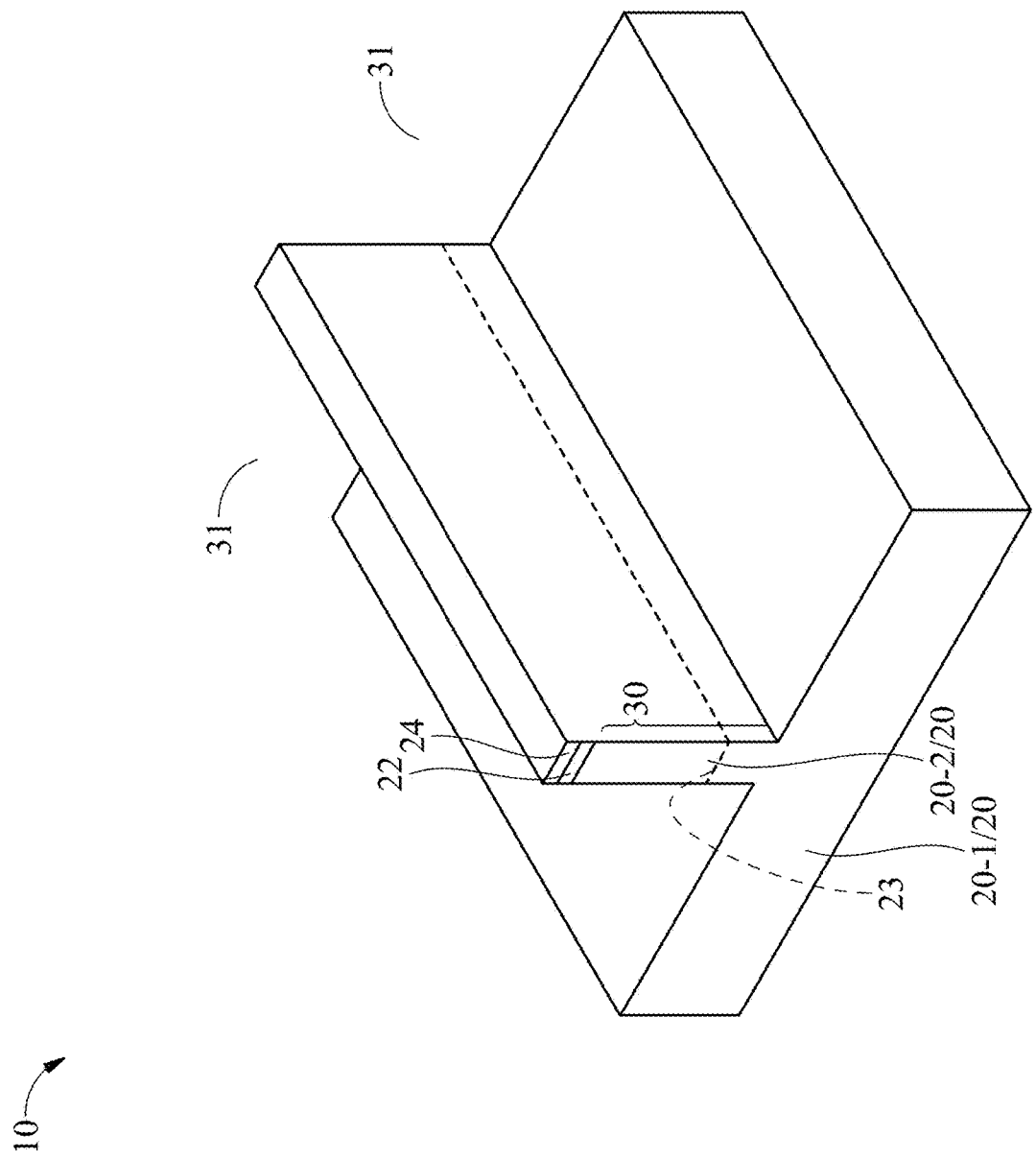

Referring to FIG. 2, mask layer 24 and pad layer 22 are etched, exposing the underlying semiconductor substrate 20. The exposed semiconductor substrate 20 is then etched, forming trenches 31. The respective process is illustrated as process 204 in the process flow 200 as shown in FIG. 30. The portions of semiconductor substrate 20 between neighboring trenches 31 are referred to as semiconductor strip 30 hereinafter, which are overlying joined to the underlying bulk portion of semiconductor substrate 20. Trenches 31 may have the shape of strips (when viewed in the top view of wafer 10) that are parallel to each other. Although one semiconductor strip 30 is illustrated in FIG. 2, a plurality of semiconductor strips 30 (refer to FIG. 3B) may be formed as being parallel to each other, with trenches 31 separating the plurality of semiconductor strips 30 from each other. In accordance with some embodiments in which epitaxy semiconductor layer 20-2 is formed, the bottoms of trenches 31 may be lower than the interface 23 between substrate portion 20-1 and epitaxy semiconductor layer 20-2.

Figure 3A:
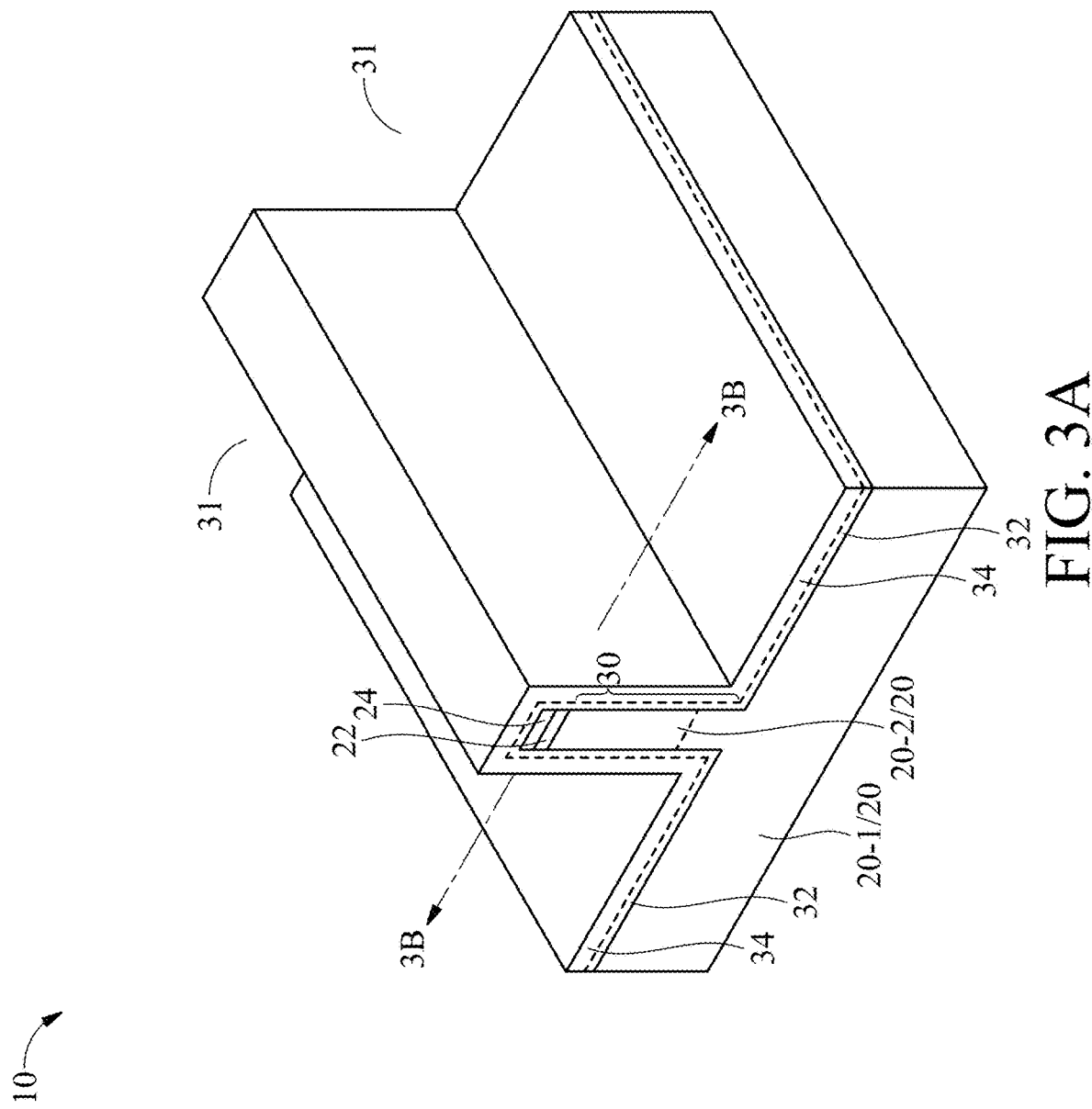
Figure 3B:
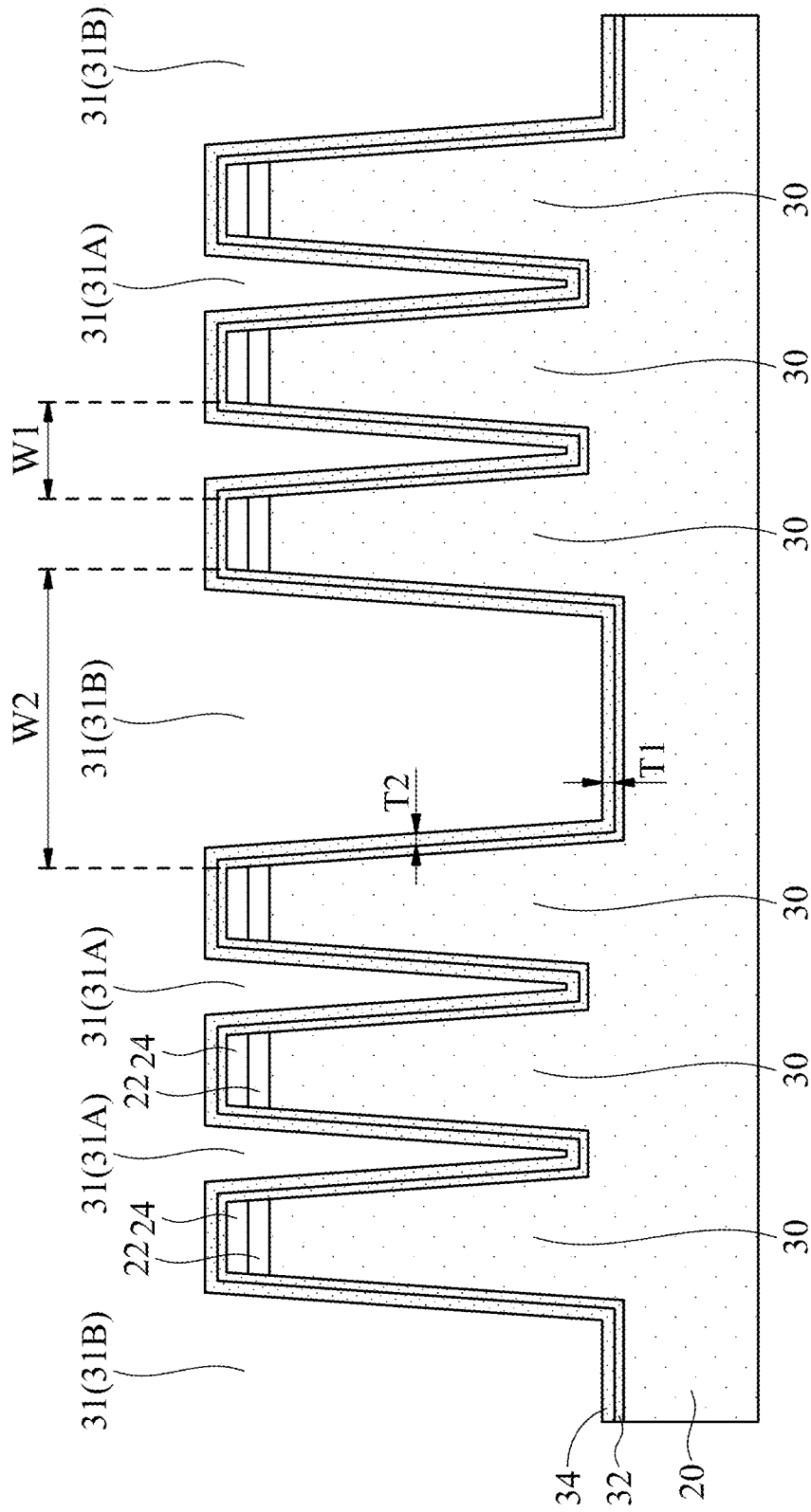

Referring to FIGS. 3A and 3B, silicon layer 32 is deposited in accordance with some embodiments. The respective process is illustrated as process 205 in the process flow 200 as shown in FIG. 30. In accordance with other embodiments, the step of depositing silicon layer 32 is omitted. The deposition may be performed through a conformal deposition process such as Low-Pressure Chemical Vapor Deposition (LPCVD), Chemical Vapor Deposition (CVD), or the like. Silicon layer 32 may be free or substantially free from other elements such as germanium, carbon, or the like. For example, the atomic percentage of silicon in silicon layer 32 may be higher than about 95 percent. Silicon layer 32 may be formed as a crystalline silicon layer or a polysilicon layer, which may be achieved, for example, by adjusting the temperature and the growth rate in the deposition process. The thickness of silicon layer 32 may be in the range between about 10 Å and about 25 Å.

When epitaxy layer 20-2 is formed in preceding steps, silicon layer 32 is formed. In the region in which epitaxy layer 20-2 is not formed and an entirety of semiconductor strip 30 is formed of silicon, silicon layer 32 may or may not be formed. In FIG. 3A, silicon layer 32 is shown using dashed lines to indicate it may or may not be formed in accordance with various embodiments.

FIGS. 3A and 3B also illustrate a perspective view and a cross-sectional view, respectively, in an intermediate stage in the growth/deposition of dielectric layer 34. The respective process is illustrated as process 206 in the process flow 200 as shown in FIG. 30. Wafer 10 is placed in an Atomic Layer Deposition (ALD) chamber (not shown), in which ALD cycles are performed to grow dielectric layer 34. The ALD process is a conformal deposition process. Accordingly, the thickness T1 (FIG. 3B) of the horizontal portions of dielectric layer 34 is equal to the thickness T2 of the vertical portions of dielectric layer 34. Thicknesses T1 and T2 may be in the range between about 15 Å and about 50 Å in accordance with some embodiments.

FIG. 3B illustrates a cross-sectional view of the reference cross-section 3B-3B in FIG. 3A, wherein a plurality of closely located semiconductor strips 30 are formed as a group, and are separated from each other by narrow trenches 31A. In accordance with some embodiments, narrow trenches 31A have small width W1, which may be smaller than about 160 Å, or in the range between about 100 Å and about 250 Å. There may also be wide trenches 31B, for example, on the opposite outer sides of the group of the closely-located semiconductor strips 30. The width W2 of wide trenches 31B is greater than width W1, for example, with ratio W2/W1 being greater than about 2.0. Width W2 may also be greater than about 150 Å. Trenches 31A and 31B are collectively referred to as trenches 31.

Figure 14:
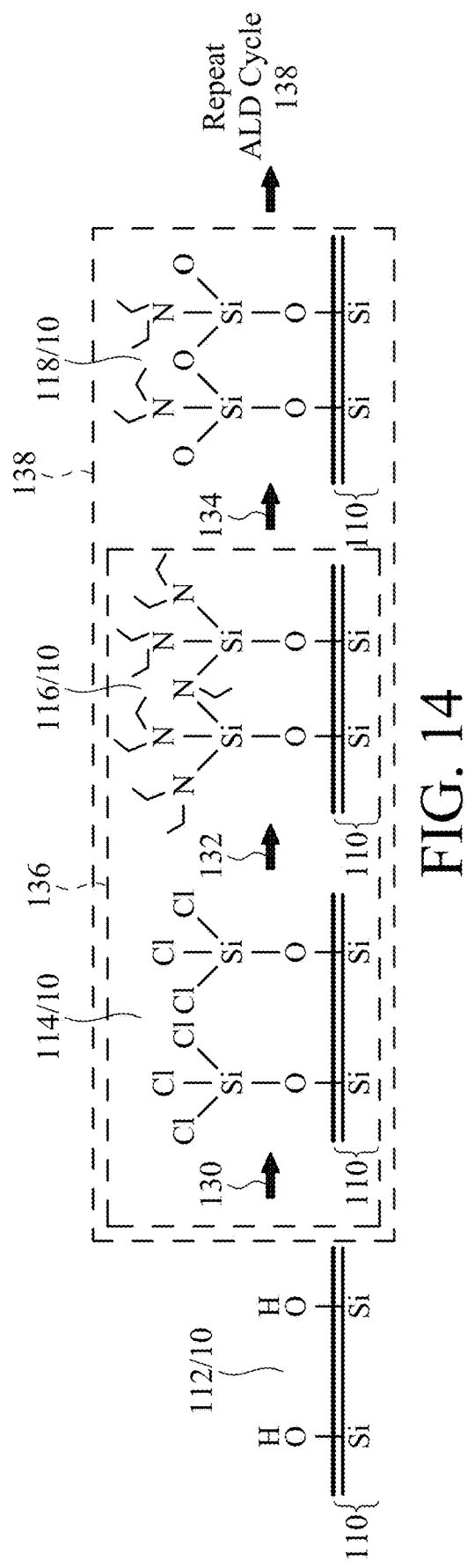
FIG. 14 illustrates an Atomic Layer Deposition (ALD) cycle in the formation of a SiNOC film in accordance with some embodiments.
Figure 15:
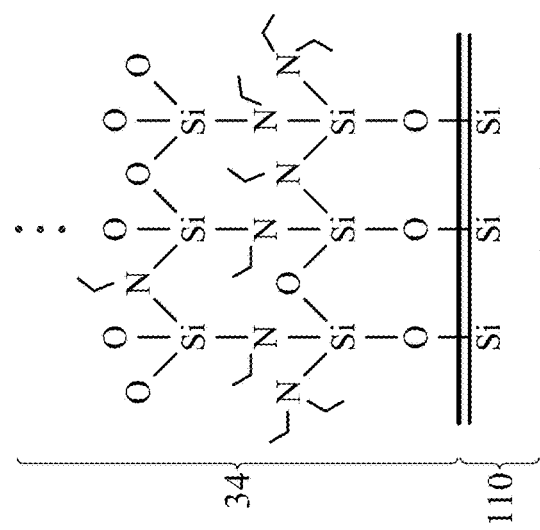
FIG. 15 illustrates an intermediate structure formed by a plurality of ALD cycles in accordance with some embodiments.

The intermediate chemical structures of dielectric layer 34 (as shown in FIGS. 3A and 3B) during its formation are shown in FIGS. 14 and 15. FIG. 14 illustrates a first ALD process to deposit dielectric layer 34. The intermediate structures shown in FIG. 14 are identified using reference numerals 112, 114, 116, and 118 to distinguish the structures generated by different steps from each other. Wafer 10 includes base layer 110, which may represent the exposed features including substrate 20, semiconductor strips 30 and silicon layer 32 (or pad layer 22 and hard masks 24 if silicon layer 32 is not formed) in FIGS. 3A and 3B. The initial structure in FIG. 14 is referred to as structure 112. In the illustrated example, base layer 110 is shown as including silicon, which may be in the form of crystalline silicon, amorphous silicon, polysilicon, or the like. Base layer 110 may also include other types of silicon-containing compounds such as silicon oxide, silicon nitride, silicon oxycarbide, silicon oxynitride, or the like. In accordance with some embodiments of the present disclosure, due to the formation of native oxide and the exposure to moisture, Si—OH bonds are formed at the surface of the silicon-containing base layer 110.

Figure 18:
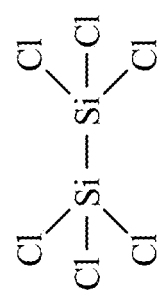

Referring to FIG. 14 again, in process 130, Hexachlorodisilane (HCD) is introduced/pulsed into the ALD chamber, in which wafer 10 (FIGS. 3A and 3B) is placed. The respective process is illustrated as process 208 in the process flow 200 as shown in FIG. 30. HCD has the chemical formula of $(SiCl_3)_2$, and FIG. 18 illustrates a chemical formula of an HCD molecule. The chemical formula shows that the HCD molecule includes chlorine atoms bonded to two silicon atoms, which are bonded to each other. When HCD is pulsed into the ALD chamber, wafer 10 may be heated, for example, to a temperature in the range between about 550° C. and about 670° C. The OH bonds as shown in structure 112 are broken, and silicon atoms along with the chlorine atoms bonded to them are bonded to oxygen atoms to form O—Si—Cl bonds. The resulting structure is referred to as structure 114. In accordance with some embodiments of the present disclosure, no plasma is turned on when HCD is introduced. The HCD gas may be kept in the ALD chamber for a period of time between about 20 seconds and about 25 seconds. The pressure of the ALD chamber may be in the range between about 100 Pa and about 150 Pa in accordance with some embodiments.

Figure 19:
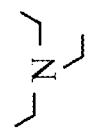
FIGS. 18 and 19 illustrate a chemical structure of hexachlorodisilane (HCD) and a symbol of triethylamine, respectively, in accordance with some embodiments.

Next, HCD is purged from the ALD chamber. The respective purging process is also illustrated as process 208 in the process flow 200 as shown in FIG. 30. In process 132, a process gas including a nitrogen atom bonded with alkyl groups may be pulsed into the ALD chamber. For example, triethylamine may be pulsed. The respective process is illustrated as process 210 in the process flow 200 as shown in FIG. 30. Triethylamine may have a chemical formula of $N(CH_2CH_3)_3$, which includes a nitrogen atom bonded to three ethyl groups $(CH_2CH_3)$. FIG. 19 illustrates a symbol of triethylamine in accordance with some embodiments. The symbol shows that triethylamine includes a nitrogen atom bonded to three ethyl groups, with each of the "<" symbols connected to the nitrogen (N) atom representing an ethyl group ($CH_2CH_3$, or a $CH_2$ molecule bonded with a $CH_3$ molecule). With the introduction/pulsing of triethylamine, the temperature of wafer 10 is also kept elevated, for example, in the range between about 550° C. and about 670° C. The temperature may also be kept the same as in the process for pulsing HCD. In accordance with some embodiments of the present disclosure, no plasma is turned on when triethylamine is introduced. During the pulsing of triethylamine, the ALD chamber may have a pressure in the range between about 800 Pa and about 1,000 Pa.

Structure 114 reacts with triethylamine. The resulting structure is referred to as structure 116, as shown in FIG. 14. During the reaction, the Si—Cl bonds in structure 114 are broken, so that nitrogen atoms (for example, in triethylamine) may be bonded to silicon atoms. A silicon atom may be bonded to three nitrogen atoms, with each of the nitrogen atoms further bonded to two ethyl groups. The triethylamine may be kept in the ALD chamber for a period of time in the range between about 5 seconds and about 15 seconds, and is then purged from the ALD chamber. The respective purging process is also illustrated as process 210 in the process flow 200 as shown in FIG. 30.

Next, as shown as process 134 in FIG. 14, oxygen ($O_2$) is pulsed into the ALD chamber. The respective process is illustrated as process 212 in the process flow 200 as shown in FIG. 30. During process 212, structure 116 reacts with oxygen to generate structure 118. The alkyl groups such as the ethyl groups in structure 116 help to convert the Si—N bonds into Si—O bonds, for example, with some of the Si—N bonds in structure 116 being broken, and silicon atoms being bonded to oxygen atoms. Some of the nitrogen atoms along with their bonding ethyl groups may also remain to be bonded to silicon atoms. Some of oxygen atoms may be bonded to two silicon atoms to generate cross-links between some of the silicon atoms. In accordance with some embodiments of the present disclosure, no plasma is turned on when oxygen is introduced. During the pulsing of oxygen, the ALD chamber may have a pressure in the range between about 800 Pa and about 1,000 Pa. Oxygen may be kept in the ALD chamber for a period of time between about 5 seconds and about 15 seconds, and is then purged from the ALD chamber. The respective purging process is also illustrated as process 212 in the process flow 200 as shown in FIG. 30.

In above-discussed processes, the processes 130 and 132 in combination may be referred to as an ALD cycle 136, with ALD cycle 136 resulting in the growth of an atomic layer, which includes silicon atoms and the corresponding bonded nitrogen atoms and ethyl groups. Also, the processes 130, 132, and 134 in combination may also be referred to as an ALD cycle 138, with ALD cycle 138 resulting in the growth of an atomic layer comprising silicon atoms and the corresponding bonded nitrogen atoms and ethyl groups, and the bonding oxygen atoms. In accordance with some embodiments, an atomic layer resulted from an ALD cycle 138 has a thickness of about 1 Å.

After the process 134 is finished, the ALD cycle 138 is repeated, so that a plurality of atomic layers are deposited to form dielectric layer 34, as shown in FIGS. 3A and 3B. In subsequent ALD cycles, the Si—O bonds and the Si—N bonds formed in a previous ALD cycle may be broken, and Si—Cl bonds may be formed due to the pulsing of HCD. The Si—Cl bonds may then be replaced with the Si—N bonds and the corresponding ethyl groups. Oxygen may then be used to form Si—O bonds, which replace some Si—N bonds. FIG. 15 illustrates the chemical structure of the resulting dielectric layer 34.

The ALD cycle 138 is repeated until the resulting dielectric layer 34 has a desirable thickness. It is appreciated that depending on the desirable thickness of dielectric layer 34, there may be many atomic layers deposited. In accordance with some embodiments of the present disclosure, the thickness of dielectric layer 34 may be, for example, in the range between about 15 Å and about 50 Å. Dielectric layer 34, as deposited, is a SiOCN layer, which is also a SiOCNH layer due to the existence of hydrogen in the alkyl groups.

In accordance with some embodiments of the present disclosure, after the ALD cycles 138, the resulting dielectric layer 34 has a carbon (atomic) percentage in the range between about 1 percent and about 15 percent. The nitrogen atomic percent in dielectric layer 34 cannot be too high or too low. If the nitrogen atomic percent is too high, semiconductor strips 30 may be bent in subsequent processes. If the nitrogen atomic percent is too low, the resulting dielectric layer 34 and resulting silicon oxide layer does not have adequate oxidation resistance, and cannot adequately protect semiconductor strips 30 from oxidation during the subsequent annealing processes. For example, the nitrogen (atomic) percentage in dielectric layer 34 may be in the range between about 5 percent and about 20 percent. The majority of the rest of the elements in dielectric layer 34 are silicon and oxygen, which may have an atomic ratio of silicon to oxygen being about 1.5:2 to about 1:2.5, and may be, for example, around about 1:2. For example, the atomic percentage of silicon may be in the range between about 20 percent and about 40 percent. The atomic percentage of oxygen may be in the range between about 50 percent and about 70 percent.

Figure 17:
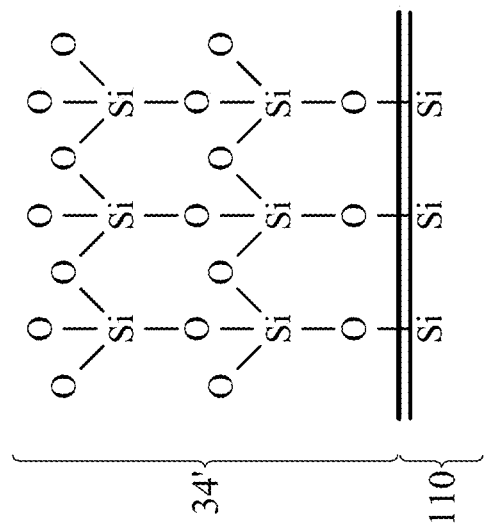
FIG. 17 illustrates a schematic chemical structure of silicon oxide after a dry anneal process in accordance with some embodiments.

After the deposition (the growth) of dielectric layer 34, an anneal process is performed. The respective process is illustrated as process 214 in the process flow 200 as shown in FIG. 30. In accordance with some embodiments of the present disclosure, the anneal process includes a low-temperature wet anneal process, a high-temperature wet anneal process, and a dry anneal process. The low-temperature process and the high-temperature wet anneal process may be performed using steam ($H_2O$) as the process gas. The dry anneal process may be performed using nitrogen ($N_2$), argon, or the like as carrier gases. The anneal processes are discussed below referring to FIGS. 16 and 17.

In accordance with some embodiments of the present disclosure, the low-temperature wet anneal process is first performed. The respective process is illustrated as process 216 in the process flow 200 as shown in FIG. 30. The low-temperature wet anneal process is performed at a relatively low temperature, for example, in the range between about 300° C. and about 450° C. The low-temperature wet anneal process may last for a period of time in the range between about 3 hours and about 5 hours. The pressure during the low-temperature anneal may be about 1 atmosphere. The low-temperature wet anneal process has two functions. The first function is to drive the water/steam ($H_2O$) molecules penetrate into dielectric layer 34. The second function is to partially convert the Si—N—C bonds, Si—$CH_3$ bonds, and Si—N—Si bonds in dielectric layer 34 into Si—OH bonds. The temperature is controlled to be high enough to incur at least partial conversion. On the other hand, the temperature of the low-temperature anneal cannot be too high. Otherwise, a surface layer of dielectric layer 34 will expand to prevent the water molecules from penetrating into inner portions of dielectric layer 34. According, the temperature range between about 300° C. and about 450° C. is selected according to experiment results.

Figure 16:
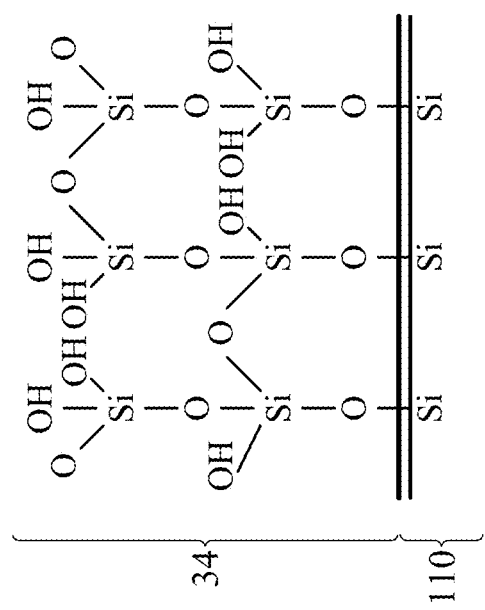
FIG. 16 illustrates a schematic structure after a low-temperature wet anneal process and a high-temperature wet anneal process are performed in accordance with some embodiments.

After the low-temperature wet anneal process, a high-temperature wet anneal process is performed. The respective process is illustrated as process 218 in the process flow 200 as shown in FIG. 30. The high-temperature wet anneal process is performed at a relatively high temperature higher than the temperature of the low-temperature wet anneal process. For example, the temperature of the high-temperature wet anneal process may be in the range between about 450° C. and about 650° C. The high-temperature wet anneal process may last for a period of time in the range between about 1.5 hours and about 2.5 hours. The pressure of the high-temperature anneal process may be about 1 atmosphere. The temperature is high enough to efficiently convert the Si—C—N bonds in dielectric layer 34 into Si—OH bonds, as schematically illustrated in FIG. 16. On the other hand, the temperature cannot be too high to cause the excess oxidation of the semiconductor materials. For example, when semiconductor strips 30 comprises SiGe, the temperature of the high-temperature anneal process should be lower than about 650° C. Otherwise, SiGe may be oxidized. Silicon may also be oxidized at temperatures higher than about 650° C., although at a lower rate. Accordingly, the temperature of the high-temperature wet anneal process may be in the range between about 500° C. and about 650° C., or between about 500° C. and about 600° C. for a high conversion rate and still with some process margin.

The high-temperature wet anneal process results in the Si—N bonds and Si—O bonds to be broken. The alkyl groups attached to the N atoms are also broken off along with the nitrogen atoms. OH groups are attached to the broken bonds. The resulting chemical structure may be schematically illustrated in FIG. 16. During the high-temperature wet anneal process, dielectric layer 34 expands, and the expansion rate in the volume may be up to about 10 percent.

After the high-temperature wet anneal process, a dry anneal process is performed to form silicon oxide. The respective process is illustrated as process 220 in the process flow 200 as shown in FIG. 30. An oxygen-free process gas such as nitrogen ($N_2$), argon, or the like may be used as the process gases. The dry anneal temperature cannot be too high or too low. If the temperature is too low, the OH bonds may not be broken adequately, and the conversion rate of Si—OH to Si—O—Si is low. If the temperature is too high, the semiconductor strips 30 (such as SiGe) may intermix with the surrounding materials. In accordance with some embodiments of the present disclosure, the dry anneal process is performed at a temperature in the range between about 600° C. and about 800° C. The dry anneal process may last for a period of time in the range between about 0.5 hours and about 1.5 hours. The pressure may be around 1 atmosphere. A carrier gas may be used to carry away the generated $H_2O$ steam. The carrier gas may be nitrogen, argon, or the like.

Figure 4:
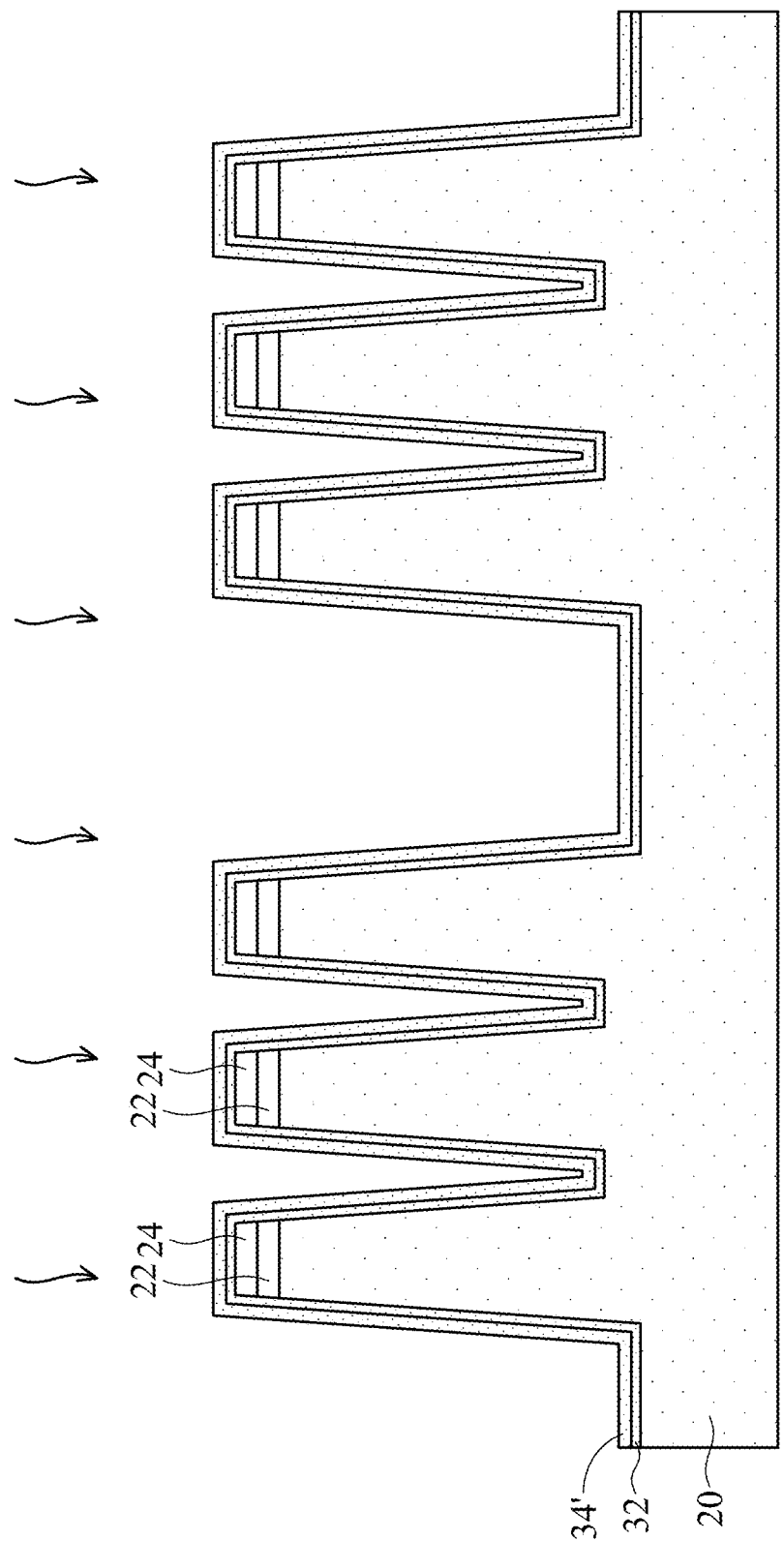

In the dry anneal process, the OH bonds and the Si—O bonds (FIG. 16) are broken, and the broken H and OH combine to form $H_2O$ molecules. The oxygen atoms, whose bonds become dangling due to the loss of H atoms, may bond with Si to form Si—O—Si bonds, and silicon oxide ($SiO_2$) is formed. The resulting dielectric layer is referred to as silicon oxide layer 34' hereinafter, which is shown in FIG. 4. After the dry anneal process is finished, there may be a small percentage of carbon and nitrogen atoms left in the silicon oxide layer 34', with the atomic percentage of each of the carbon and nitrogen being smaller than about 1 percent, and possibly between about 0.5 percent and about 1.0 percent. This is different from the STI regions formed using conventional methods, in which carbon may not exist. Furthermore, since the carbon and nitrogen atoms are the residue atoms of the deposited dielectric layer 34, the distribution of the carbon and nitrogen atoms may be substantially planar. Also, since the HCD comprises chlorine atoms, dielectric layer 34 comprises chlorine atoms, and hence silicon oxide layer 34' may also comprise a small amount of chlorine atoms therein, for example, smaller than about 1 percent, and possibly between about 0.5 percent and about 1.0 percent.

Figure 5A:
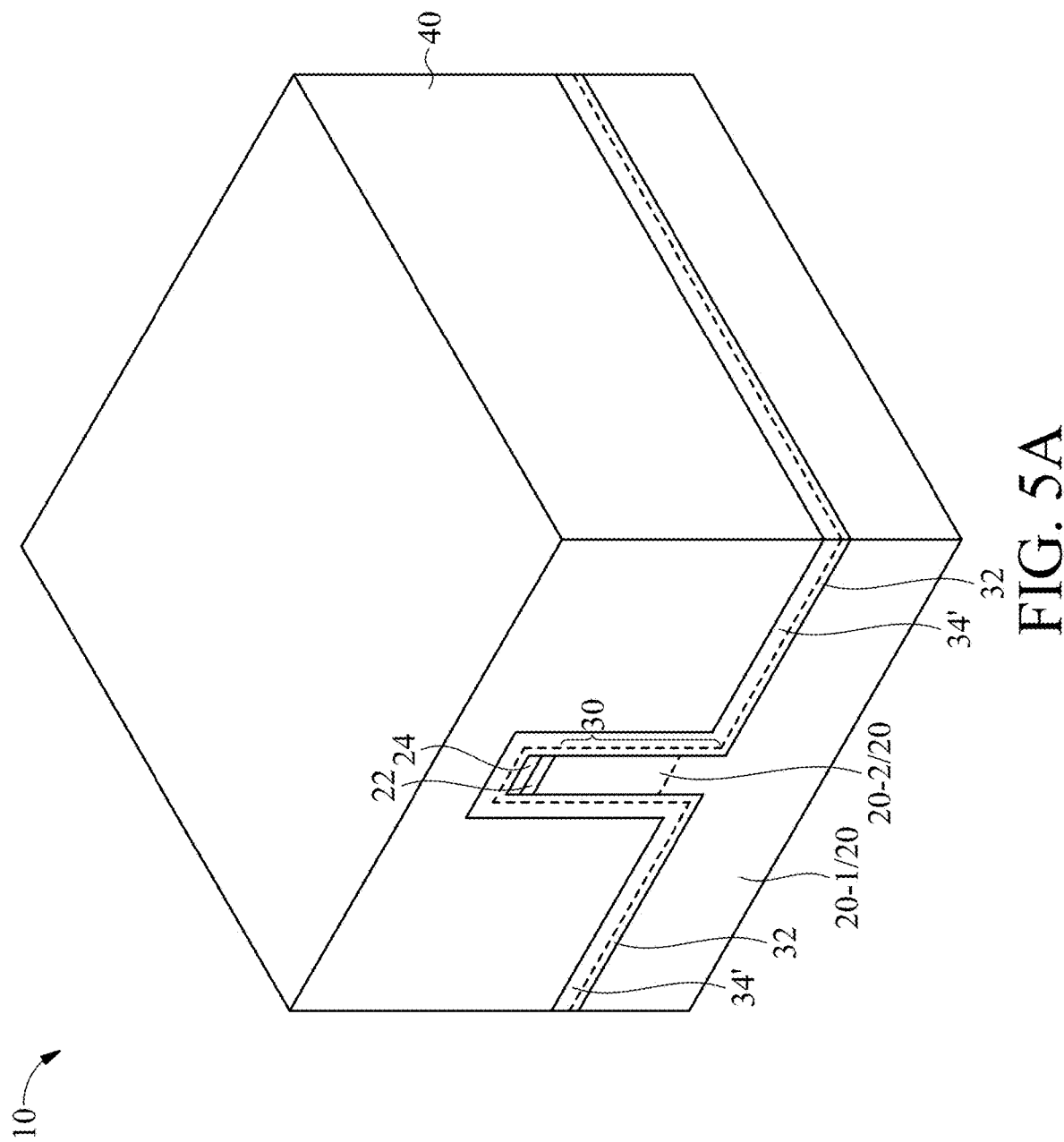
Figure 5B:
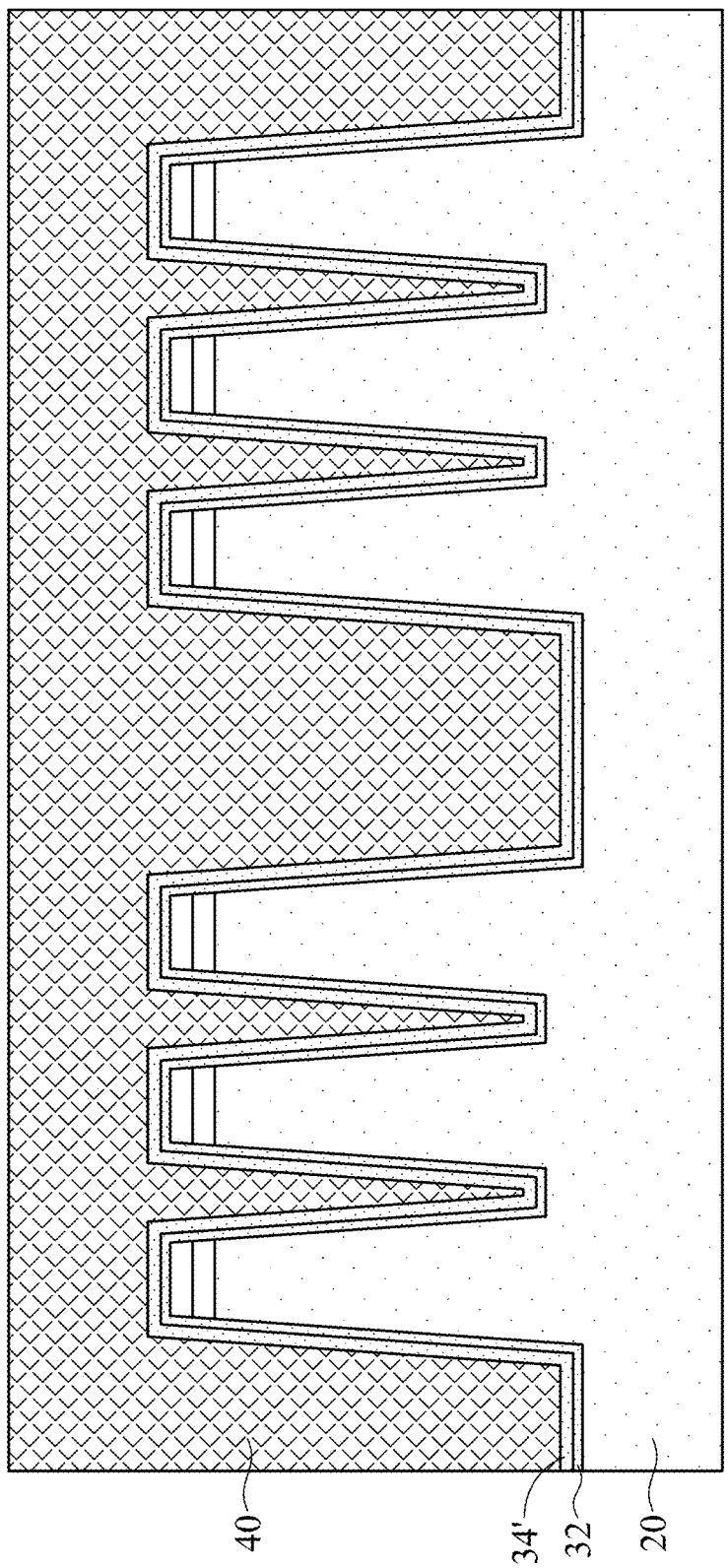

Referring to FIGS. 5A and 5B, the remaining trenches 31 are filled with dielectric layer (region) 40. The respective process is illustrated as process 222 in the process flow 200 as shown in FIG. 30. Dielectric layer 40 may be a deposited silicon nitride layer, carbon-containing dielectric, or the like formed using, for example, ALD, High-Density Plasma Chemical Vapor Deposition (HDPCVD), or Chemical Vapor Deposition (CVD). Dielectric layer 40 may also be formed using Flowable Chemical Vapor Deposition (FCVD), spin-on coating, or the like. Dielectric layer 40 is deposited to a level higher than the top surface of silicon oxide layer 34'. Dielectric layer 40 may be free from carbon therein, free from chlorine therein, and may or may not include nitrogen atoms therein. When comprising nitrogen, the atomic percentage of nitrogen is higher than the atomic percentage of nitrogen in silicon oxide layer 34'. For example, the atomic percentage of nitrogen in dielectric region 40 may be higher than about 30 percent. Furthermore, due to the formation method, dielectric region 40 may have a density smaller than the density of silicon oxide layer 34'.

The formation of dielectric layer 40 may include anneal processes, which may also involve, for example, wet anneal using water steam. During the above-discussed anneal processes including the anneal processes for converting dielectric layer 34 into silicon oxide layer 34', SiOCN layer 34 and the resulting converted silicon oxide layer 34' have good ability to prevent the oxidation of semiconductor strips 30. This ability is referred to as oxidation resistance.

A planarization process such as a Chemical Mechanical Polish (CMP) process or a mechanical grinding process is then performed to remove excessing portions of the dielectric materials including silicon oxide layer 34' and dielectric layer 40. The respective process is also illustrated as process 222 in the process flow 200 as shown in FIG. 30. The remaining portions of the dielectric materials(s) are STI regions. The planarization process may be performed using hard masks 24 as a CMP stop layer.

Figure 6A:
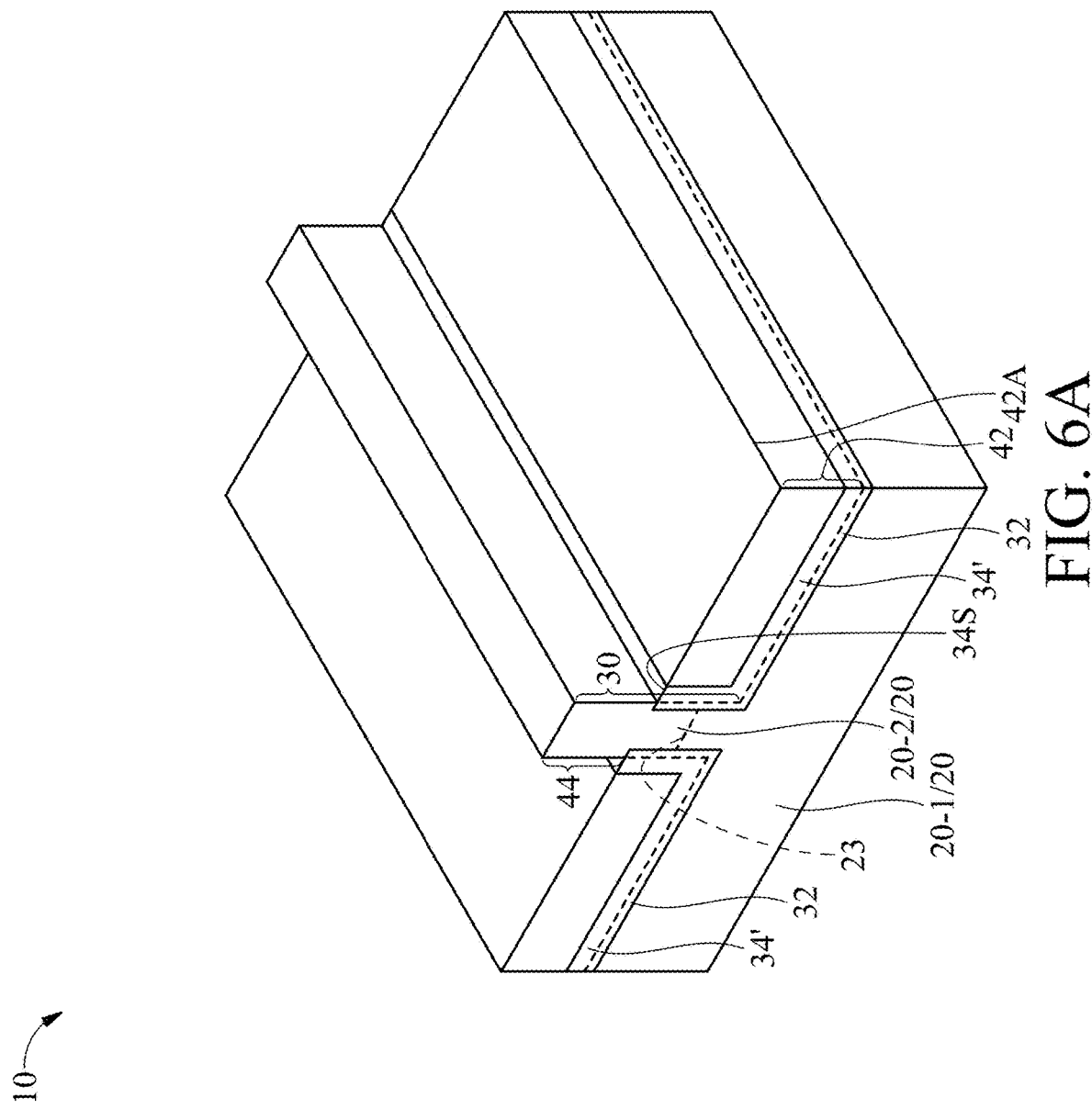
Figure 6B:
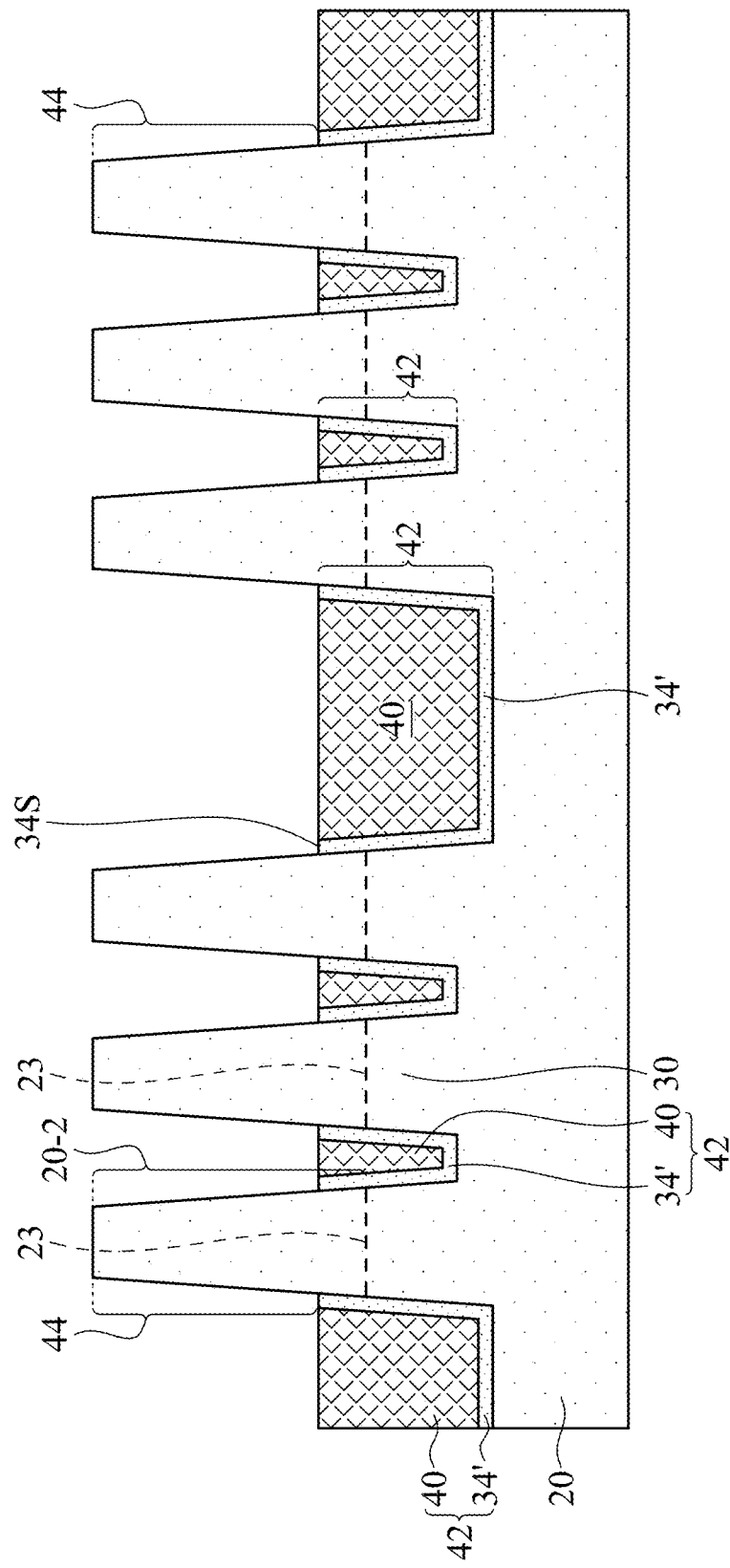
Figure 6C:
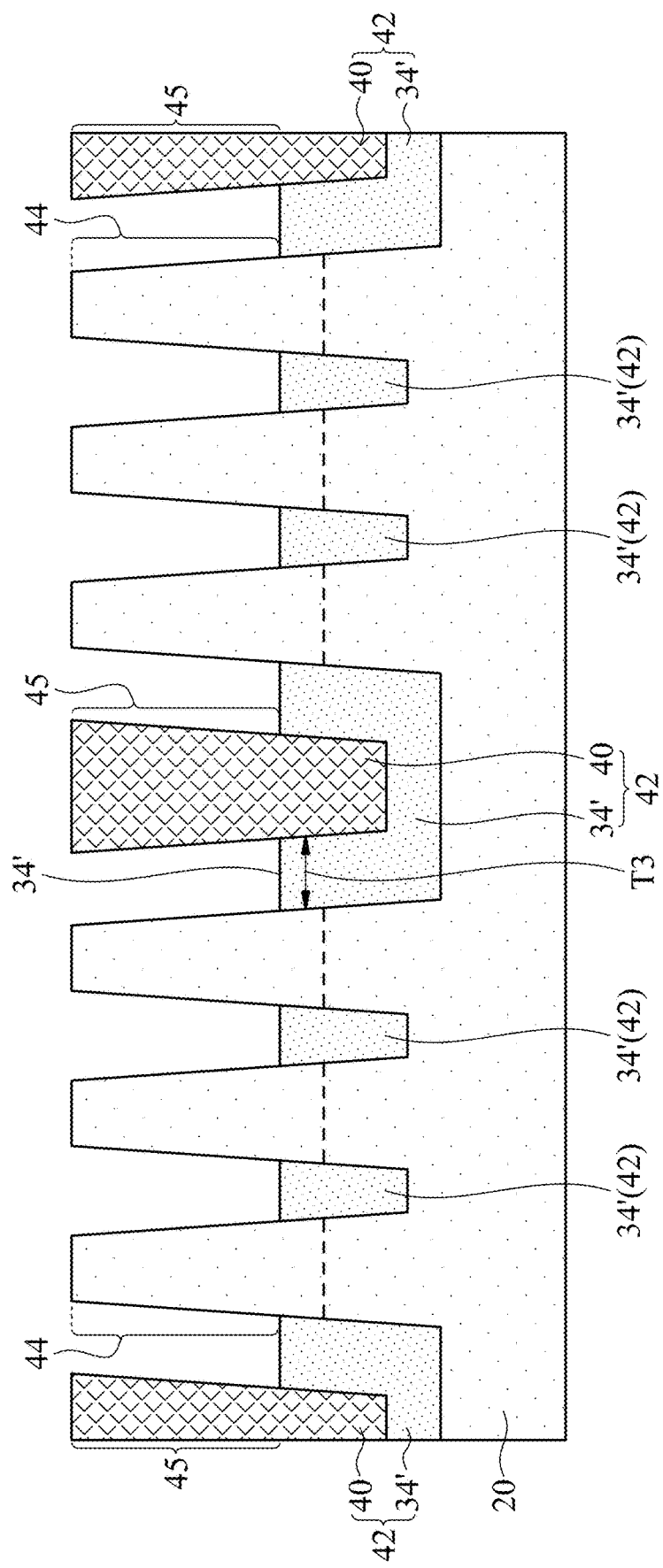

In a subsequent process, as shown in FIGS. 6A, 6B and 6C, STI regions 42 as formed in preceding processes are recessed, so that the top portions of semiconductor strips 30 protrude higher than the top surfaces 34S (FIGS. 6B and 6C) of silicon oxide layer 34' to form protruding fins 44. The respective process is illustrated as process 224 in the process flow 200 as shown in FIG. 30. The recessing of the dielectric regions may be performed using a dry etch process, in which $HF_3$ and $NH_3$ are used as the etching gases. In accordance with alternative embodiments of the present disclosure, the recessing of dielectric layer 34 is performed using a wet etch process. The etching chemical may include HF solution, for example. Hard masks 24 and pad oxide layers 22 (FIGS. 5A and 5B) are also removed. In accordance with some embodiments of the present disclosure, the bottoms of the protruding fins 44 are at a level higher than the bottom surface 23 of epitaxy layer 20-2 (if formed).

In accordance with some embodiments, both silicon oxide layer 34' and dielectric regions 40 are recessed, as shown in FIG. 6B. In accordance with alternative embodiments, as shown in FIG. 6C, silicon oxide layer 34' is recessed, and dielectric regions 40 are not etched, resulting in dummy dielectric fins 45 to protrude higher than the top surfaces 34S of the remaining portions of silicon oxide layer 34'. Dummy dielectric fins 45 may be formed when silicon oxide layer 34' are thick enough to allow the subsequently formed gate stacks and gate spacers to fill into the spaces between protruding semiconductor fins 44 and dummy dielectric fins 45. In accordance with these embodiments, the thickness T3 of silicon oxide layer 34' may be increased, for example, to greater than about 30 Å, and may be in the range between about 10 Å nm and about 100 Å. Due to the conformal deposition of dielectric layer 34, the wide trenches 31B (FIG. 2B) are not fully filled when the narrow trenches 31A are filled by dielectric layer 34. This makes the filling of dielectric layer 40 possible when silicon oxide layer 34' is thick, and makes the formation of dummy dielectric fins 45 possible. The generation of the dummy fins helps to improve the device performance of the FinFETs when the dimensions of FinFETs are very small.

In above-illustrated embodiments, semiconductor fins may be formed by any suitable method. For example, the semiconductor fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 7:
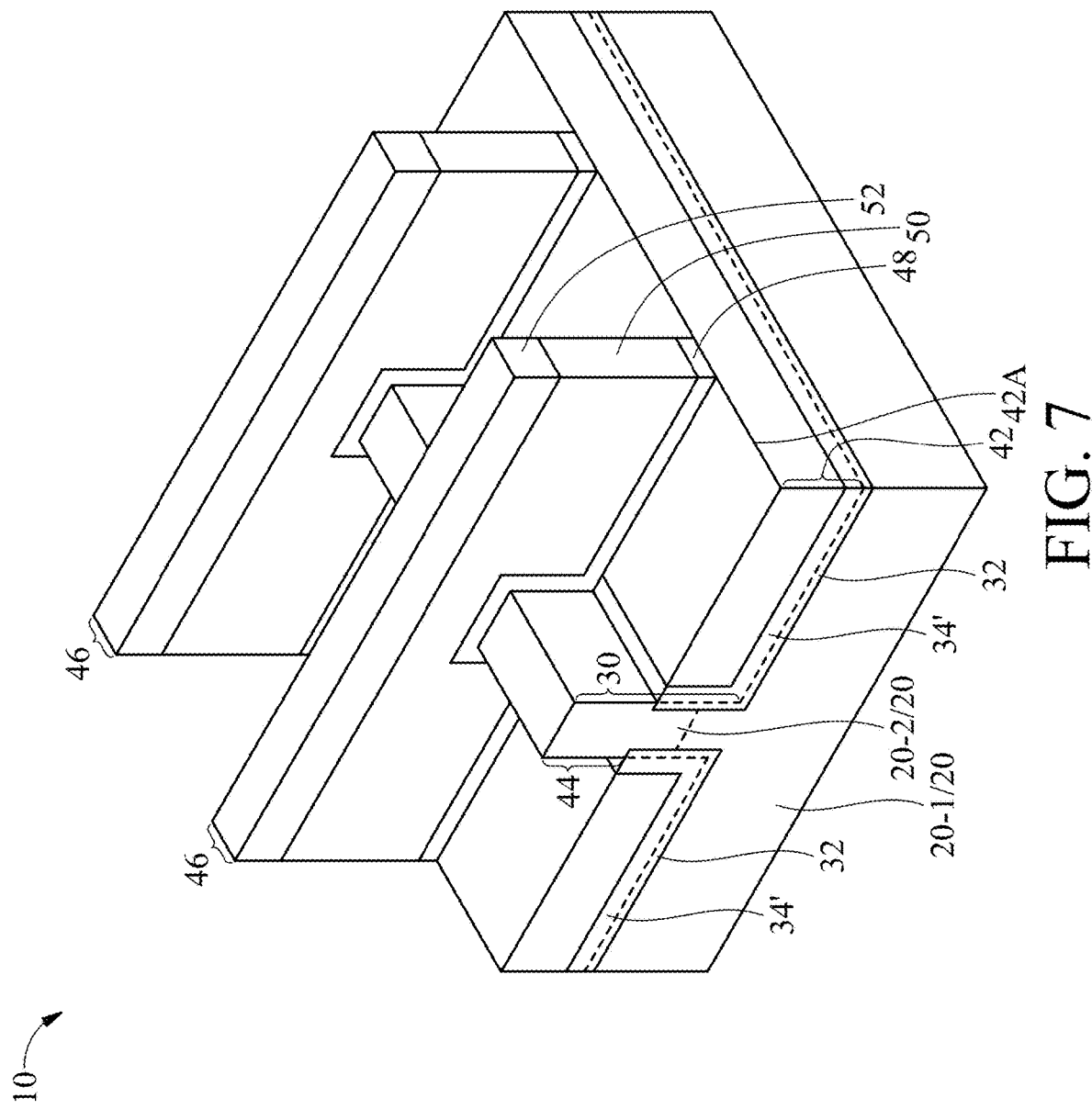

Referring to FIG. 7, dummy gate stacks 46 are formed to cross protruding fin 44. Dummy gate stacks 46 may include dummy gate dielectrics 48 and dummy gate electrodes 50 over dummy gate dielectrics 48. Dummy gate dielectrics 48 may be formed of silicon oxide or other dielectric materials. Dummy gate electrodes 50 may be formed, for example, using polysilicon or amorphous silicon, and other materials may also be used. Each of dummy gate stacks 46 may also include one (or a plurality of) hard mask layer 52 over dummy gate electrode 50. Hard mask layers 52 may be formed of silicon nitride, silicon oxide, silicon carbo-nitride, or multi-layers thereof. Dummy gate stacks 46 may cross over a single one or a plurality of protruding fins 44 and/or STI regions 42. Dummy gate stacks 46 also have lengthwise directions perpendicular to the lengthwise directions of protruding fins 44. The formation of dummy gate stacks 46 may include depositing a dummy gate dielectric layer, depositing a gate electrode layer over the dummy gate dielectric layer, depositing a hard mask layer, and patterning the stack layers to form dummy gate stacks 46.

Figure 8:
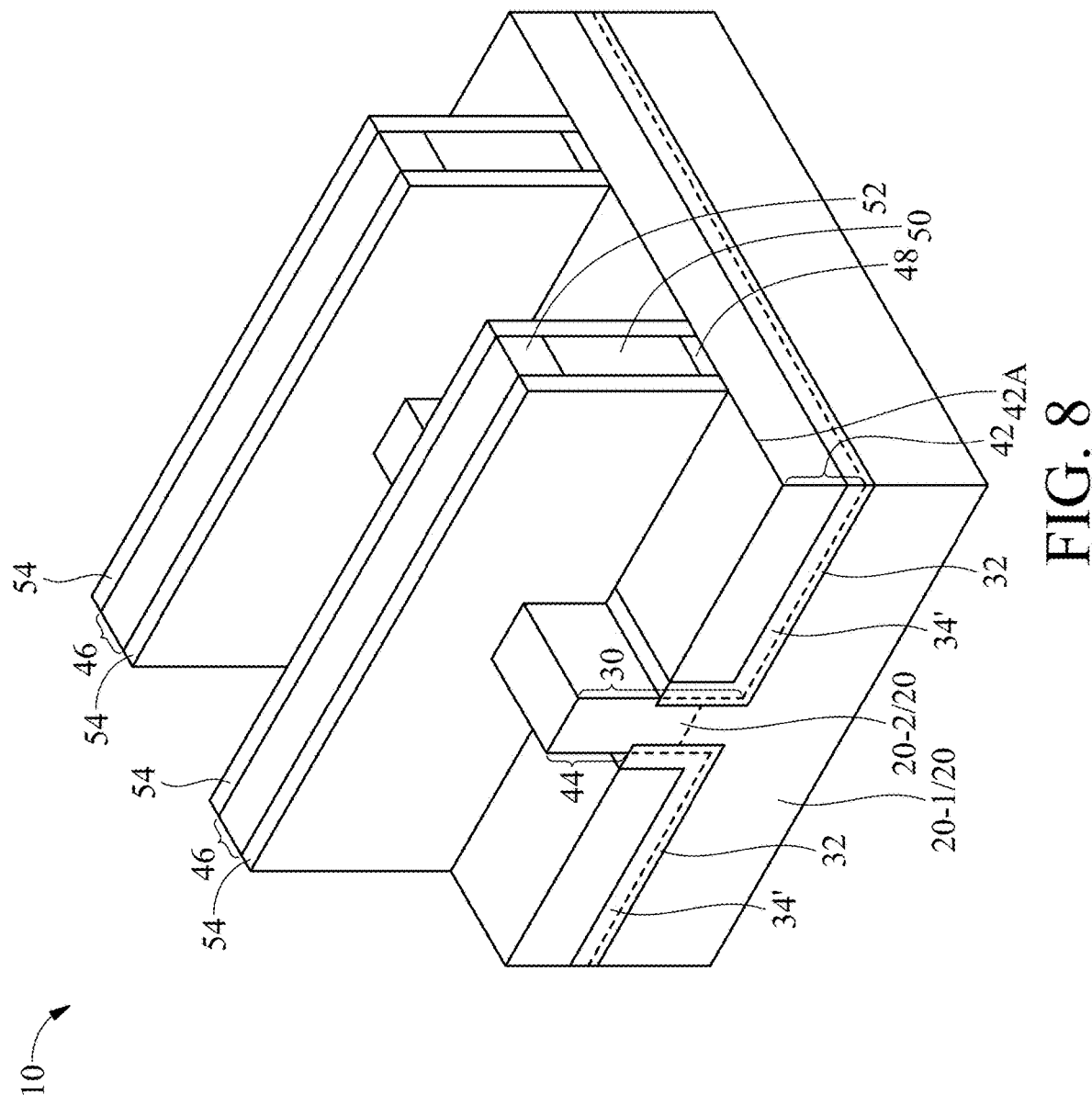

Next, referring to FIG. 8, gate spacers 54 are formed on the sidewalls of dummy gate stacks 46. The formation of gate spacers 54 may include depositing a blanket dielectric layer, and performing an anisotropic etch to remove the horizontal portions of the dielectric layer, leaving gate spacers 54 to be on the sidewalls of dummy gate stacks 46. In accordance with some embodiments of the present disclosure, gate spacers 54 are formed of an oxygen-containing dielectric material (an oxide) such as $SiO_2$, SiOC, SiOCN, or the like. In accordance with some embodiments of the present disclosure, gate spacers 54 may also include a non-oxide dielectric material such as silicon nitride.

Figure 9:
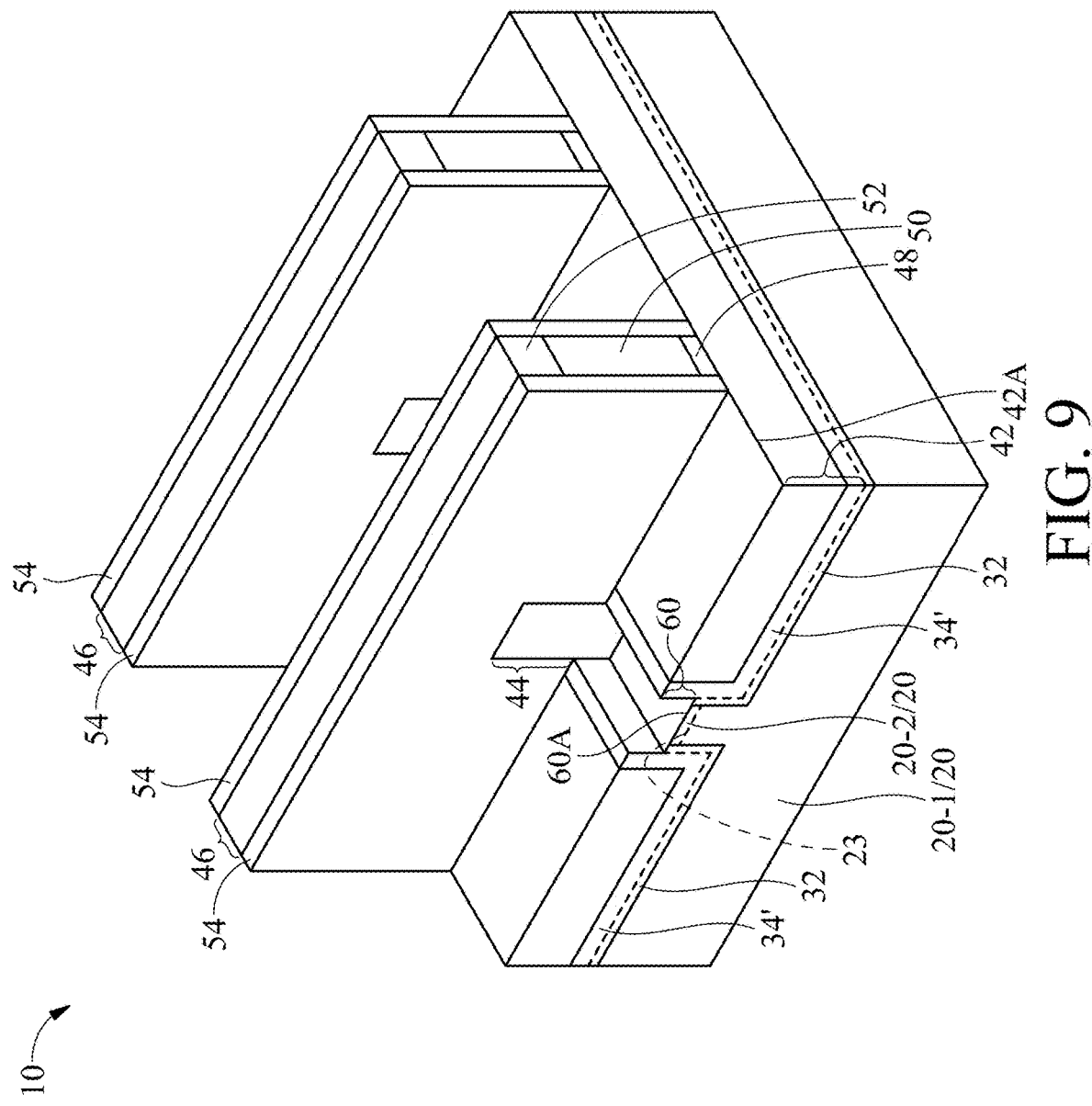

An etching process is then performed to etch the portions of protruding fins 44 that are not covered by dummy gate stacks 46 and gate spacers 54, resulting in the structure shown in FIG. 9. The recessing of protruding fins 44 may be performed through an anisotropic etching process, and hence the portions of protruding fins 44 directly underlying dummy gate stacks 46 and gate spacers 54 are protected, and are not etched. The top surfaces of the recessed semiconductor strip 30 may be lower than the top surfaces 42A of STI regions 42 in accordance with some embodiments. The spaces previous occupied by the etched portions of protruding fins 44 are referred to as recesses 60 hereinafter. Recesses 60 include some portions between STI regions 42 (as shown in FIG. 9), and some portions higher than STI regions 42 and between gate stacks 46. In the recessing process, the portions of silicon layer 32 higher than the bottom surfaces 60A of recesses 60 are also etched, hence the sidewalls of silicon oxide layer 34' may be exposed. If silicon oxide layer 34' is very thin, the exposed portions of silicon oxide layer 34' may also be consumed in the formation of recesses 60. The bottom surfaces 60A may also be higher than, level with, or lower than, the interface 23. Accordingly, there may be, or may not be, remaining portions of epitaxy semiconductor layer 20-2 directly underlying recesses 60.

Figure 10:
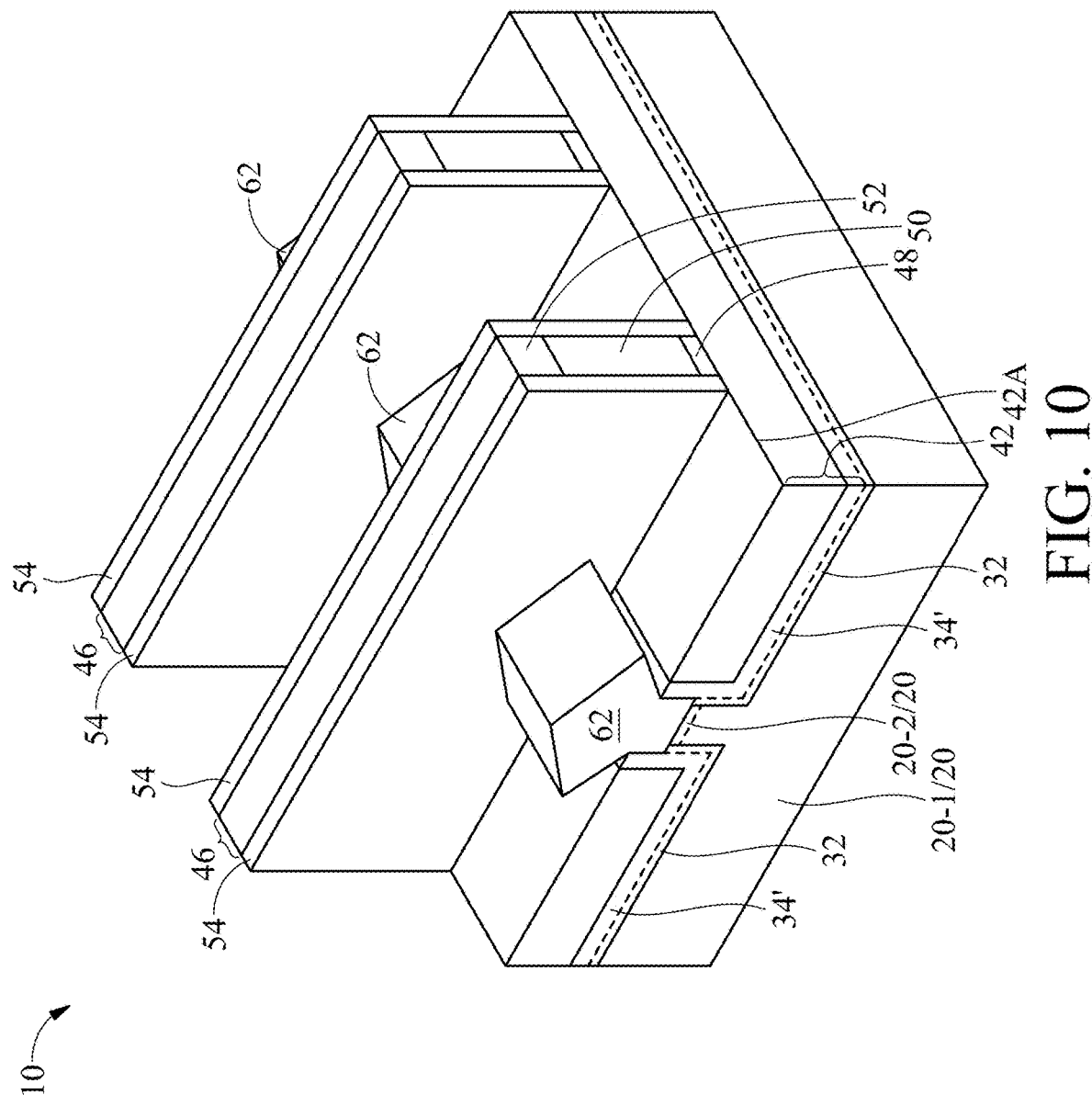

Next, epitaxy regions (source/drain regions) 62 are formed by selectively growing a semiconductor material from recesses 60, resulting in the structure in FIG. 10. In accordance with some embodiments of the present disclosure, epitaxy regions 62 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 62 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 62 fully fill recesses 60, epitaxy regions 62 start expanding horizontally, and facets may be formed.

After the epitaxy process, epitaxy regions 62 may be further implanted with a p-type or an n-type impurity to form source and drain regions, which are also denoted using reference numeral 62. In accordance with alternative embodiments of the present disclosure, the implantation process is skipped when epitaxy regions 62 are in-situ doped with the p-type or n-type impurity during the epitaxy.

Figure 11:
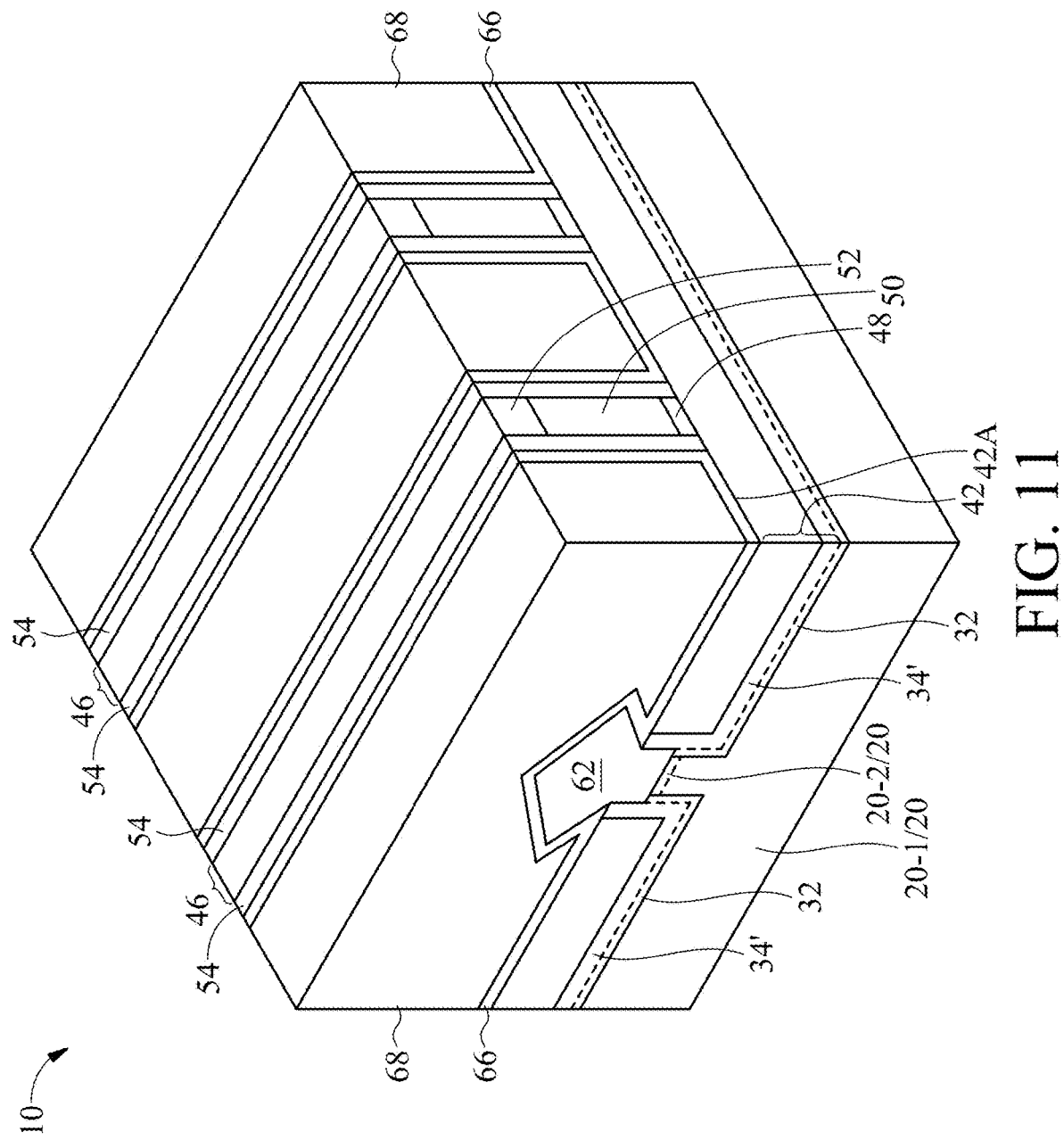

FIG. 11 illustrates a perspective view of the structure after the formation of Contact Etch Stop Layer (CESL) 66 and Inter-Layer Dielectric (ILD) 68. CESL 66 may be formed of silicon nitride, silicon carbo-nitride, or the like. CESL 66 may be formed using a conformal deposition method such as ALD or CVD, for example. ILD 68 may include a dielectric material formed using, for example, FCVD, spin-on coating, CVD, or other deposition methods. ILD 68 may also be formed of an oxygen-containing dielectric material, which may be a silicon-oxide based material such as silicon oxide, a Tetra Ethyl Ortho Silicate (TEOS) oxide, a Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 68, dummy gate stacks 46, and gate spacers 54 with each other. In the formation of ILD 68, an anneal process may be adopted.

Figure 12:
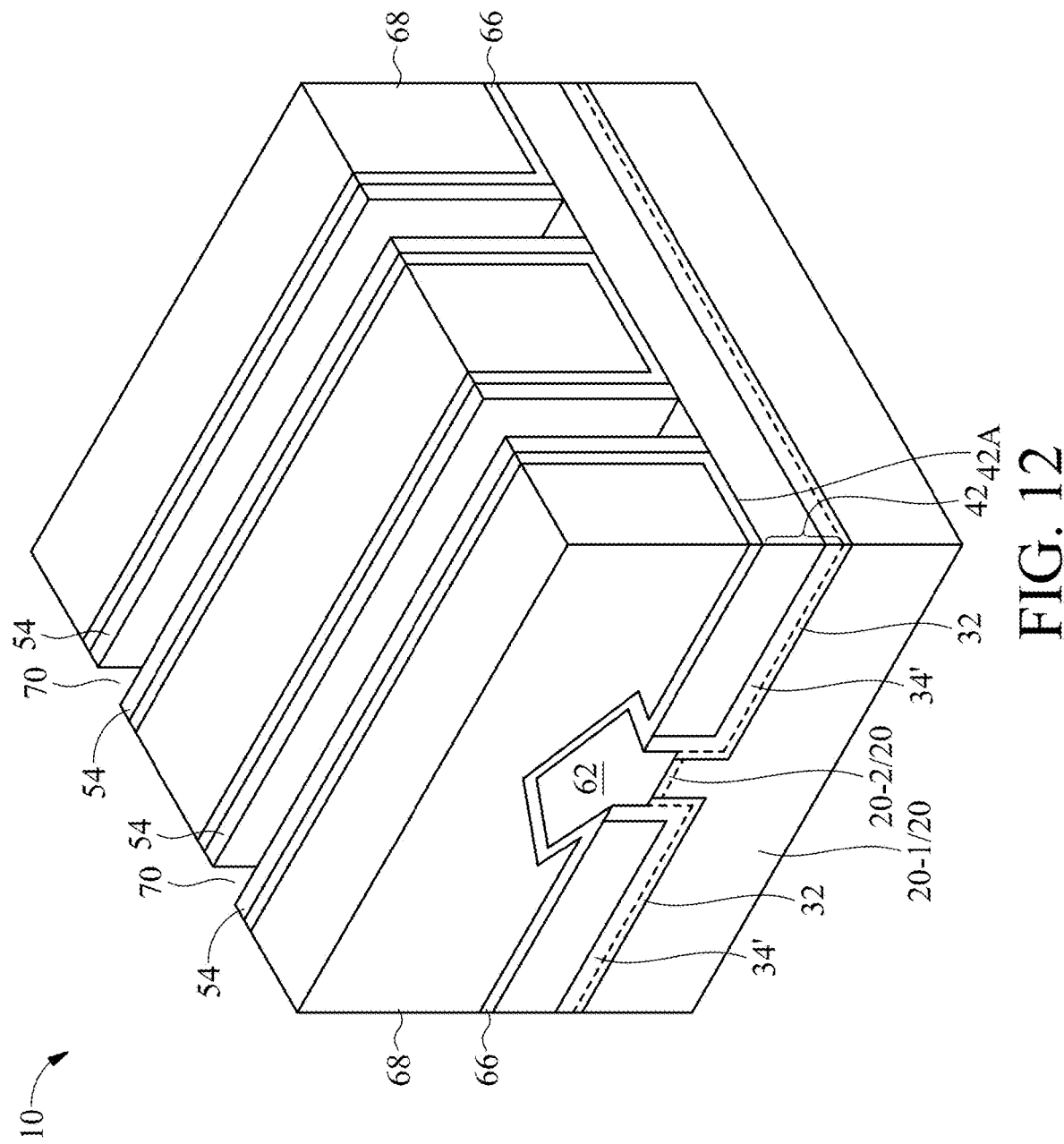

Next, dummy gate stacks 46, which include hard mask layers 52, dummy gate electrodes 50 and dummy gate dielectrics 48, are etched in one or a plurality of etching processes, resulting in trenches 70 to be formed between opposite portions of gate spacers 54, as shown in FIG. 12. The etching process may be performed using, for example, dry etching.

Figure 13A:
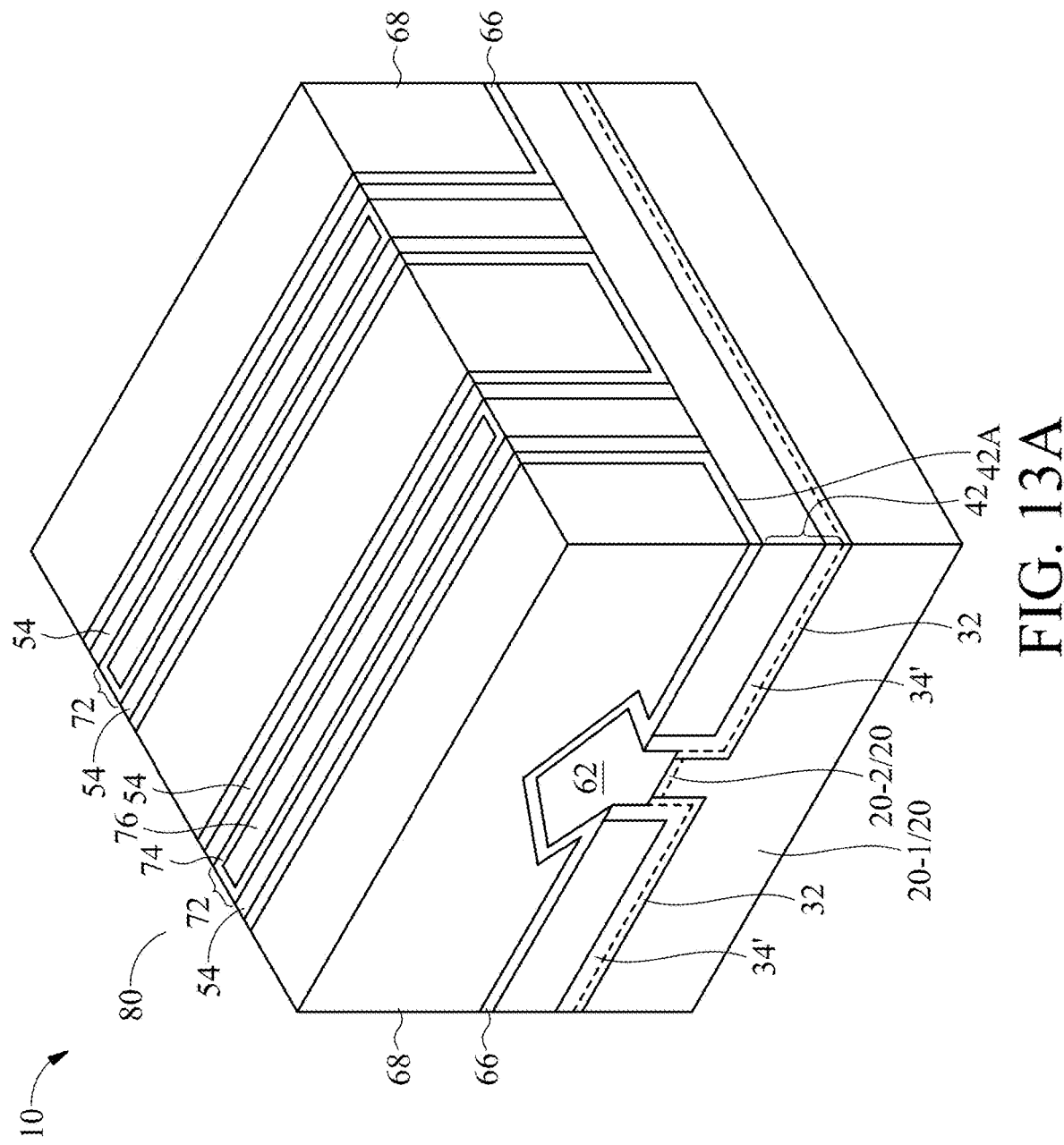

Next, referring to FIG. 13A, (replacement) gate stacks 72 are formed, which include gate dielectrics 74 and (replacement metal) gate electrodes 76. The formation of gate stacks 72 includes forming/depositing a plurality of layers, and then performing a planarization process such as a CMP process or a mechanical grinding process. Gate dielectrics 74 extend into the trenches 70 (FIG. 12). In accordance with some embodiments of the present disclosure, gate dielectrics 74 include Interfacial Layers (ILs) as their lower parts. The ILs are formed on the exposed surfaces of protruding fin 44. The ILs may include an oxide layer such as a silicon oxide layer. Gate dielectrics 74 may also include high-k dielectric layers formed over the ILs. The high-k dielectric layers may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. Gate electrodes 76 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include aluminum, copper, or cobalt. FinFET 80 is thus formed.

Figure 13B:
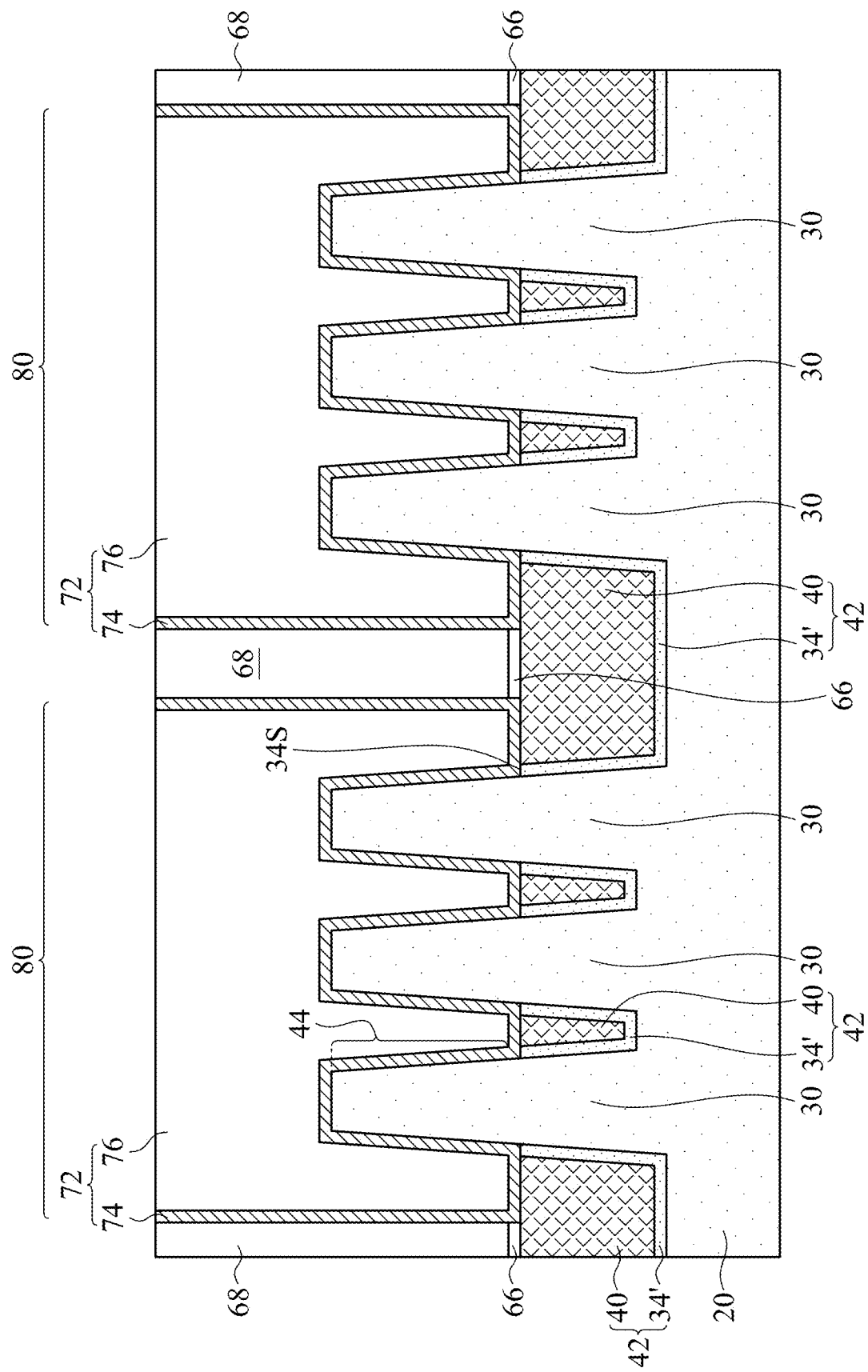
Figure 13C:
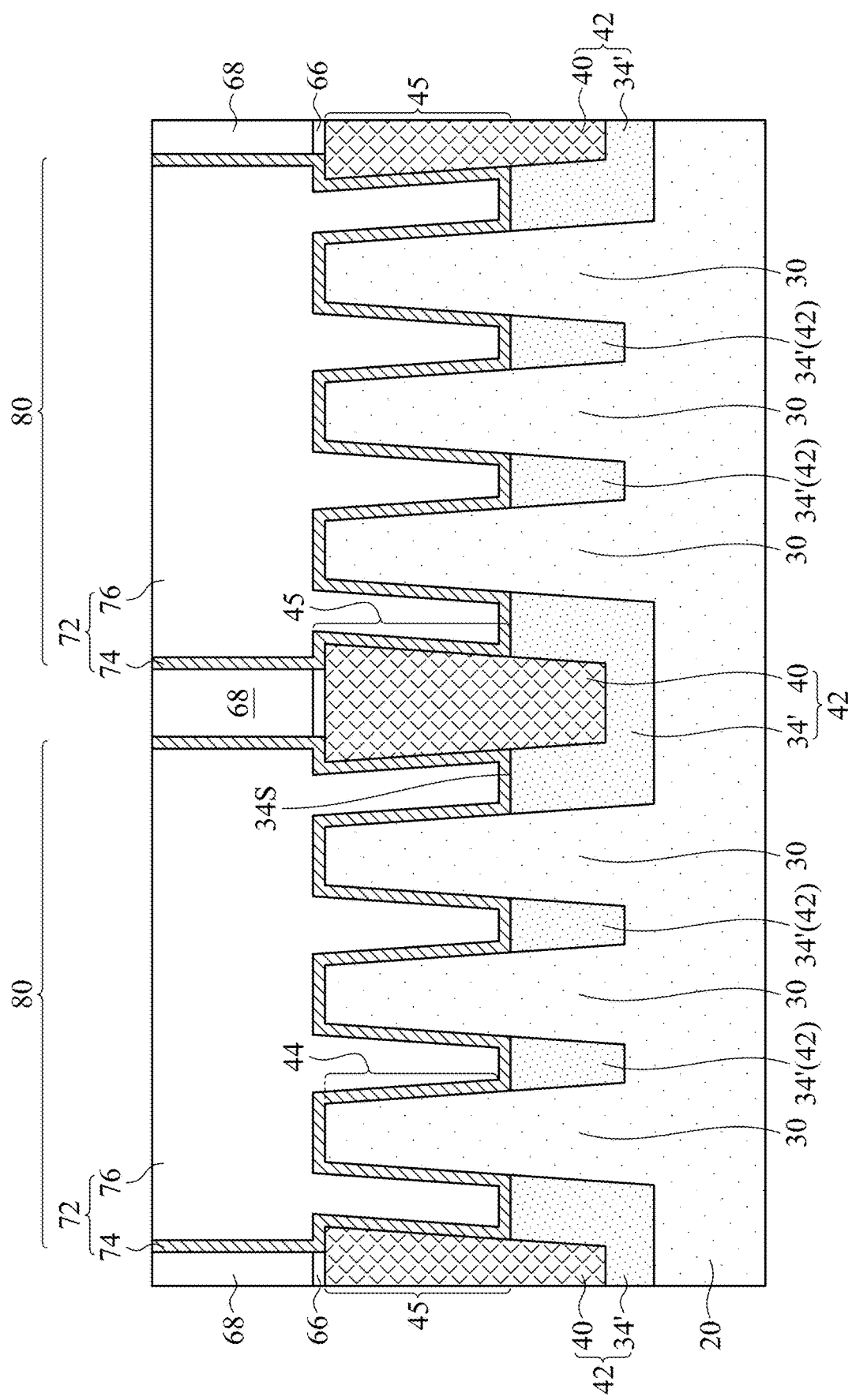

FIG. 13B illustrates a cross-sectional view of FinFETs 80, wherein the gate stacks 72 including gate dielectrics 74 and gate electrodes 76 overlap STI regions 42, and are in contact with the top surface 34S of silicon oxide layer 34'. FIG. 13C illustrates a cross-sectional view of FinFETs 80, wherein the gate stacks 72 including gate dielectrics 74 and gate electrodes 76 overlap STI regions 42 and dummy dielectric fins 45, and are in contact with the top surface 34S of silicon oxide layer 34'.

Figure 20:
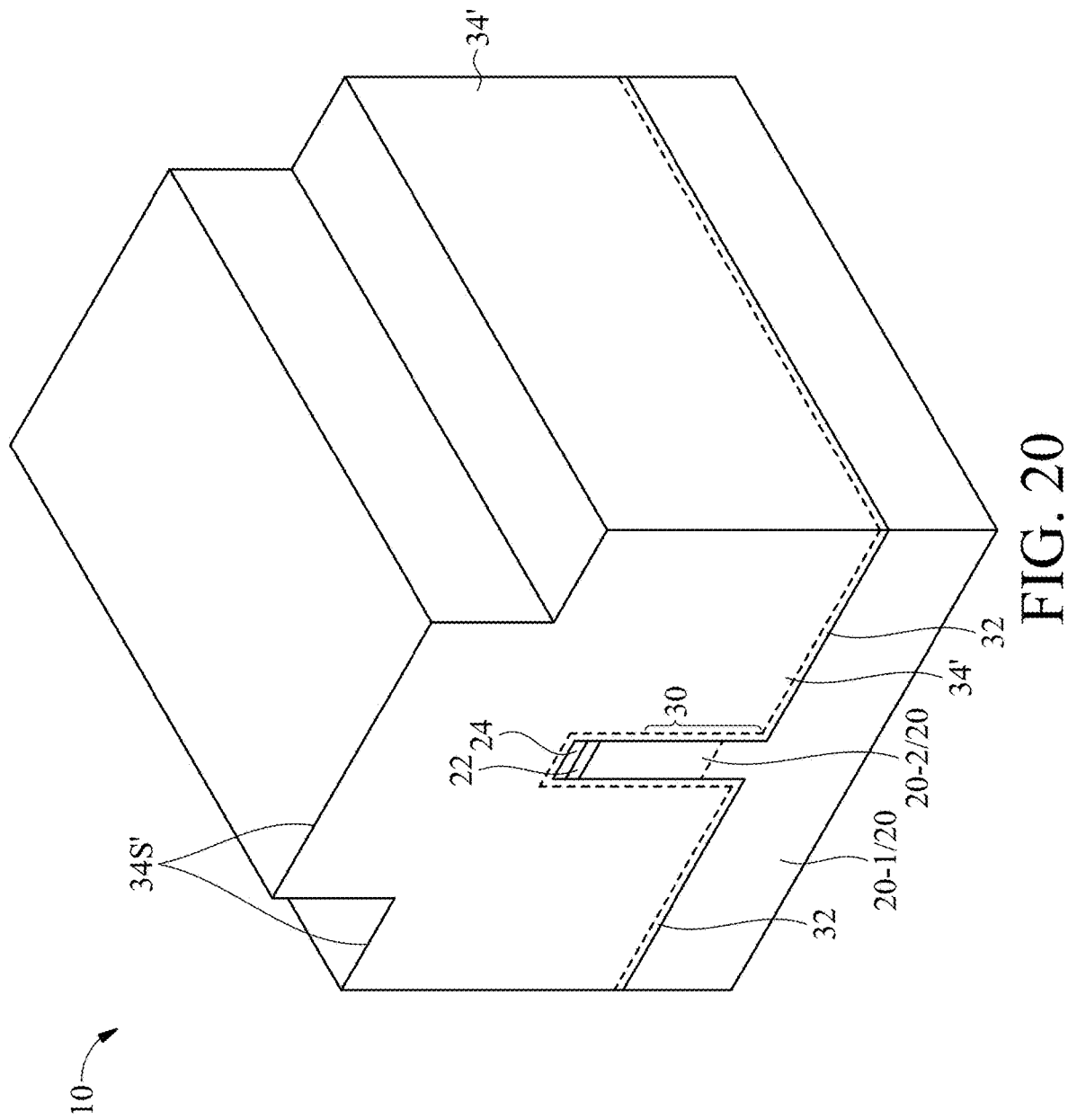
FIGS. 20 through 22 are perspective views of intermediate stages in the formation of STI regions and FinFETs in accordance with some embodiments.
Figure 21:
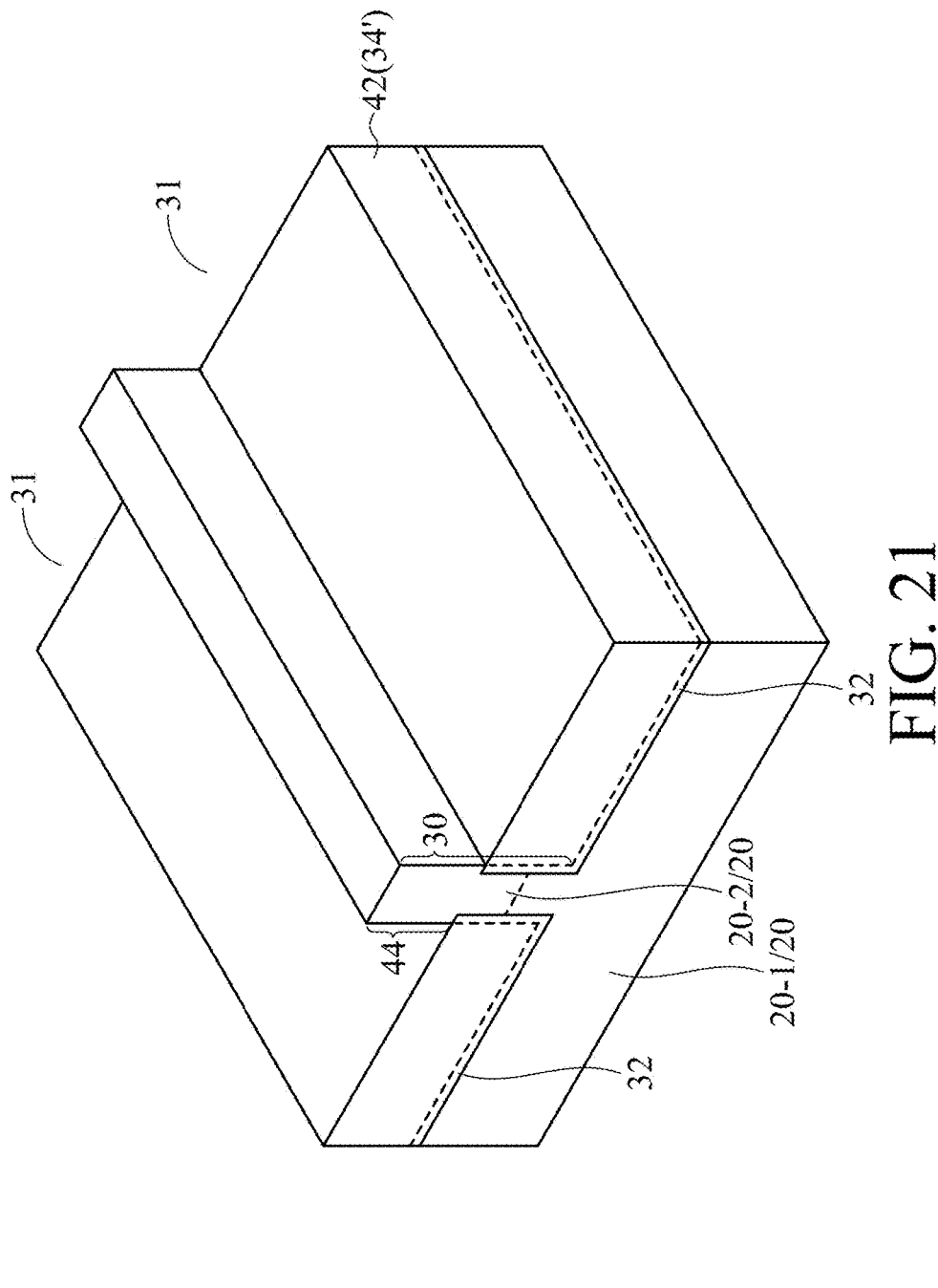
Figure 22:
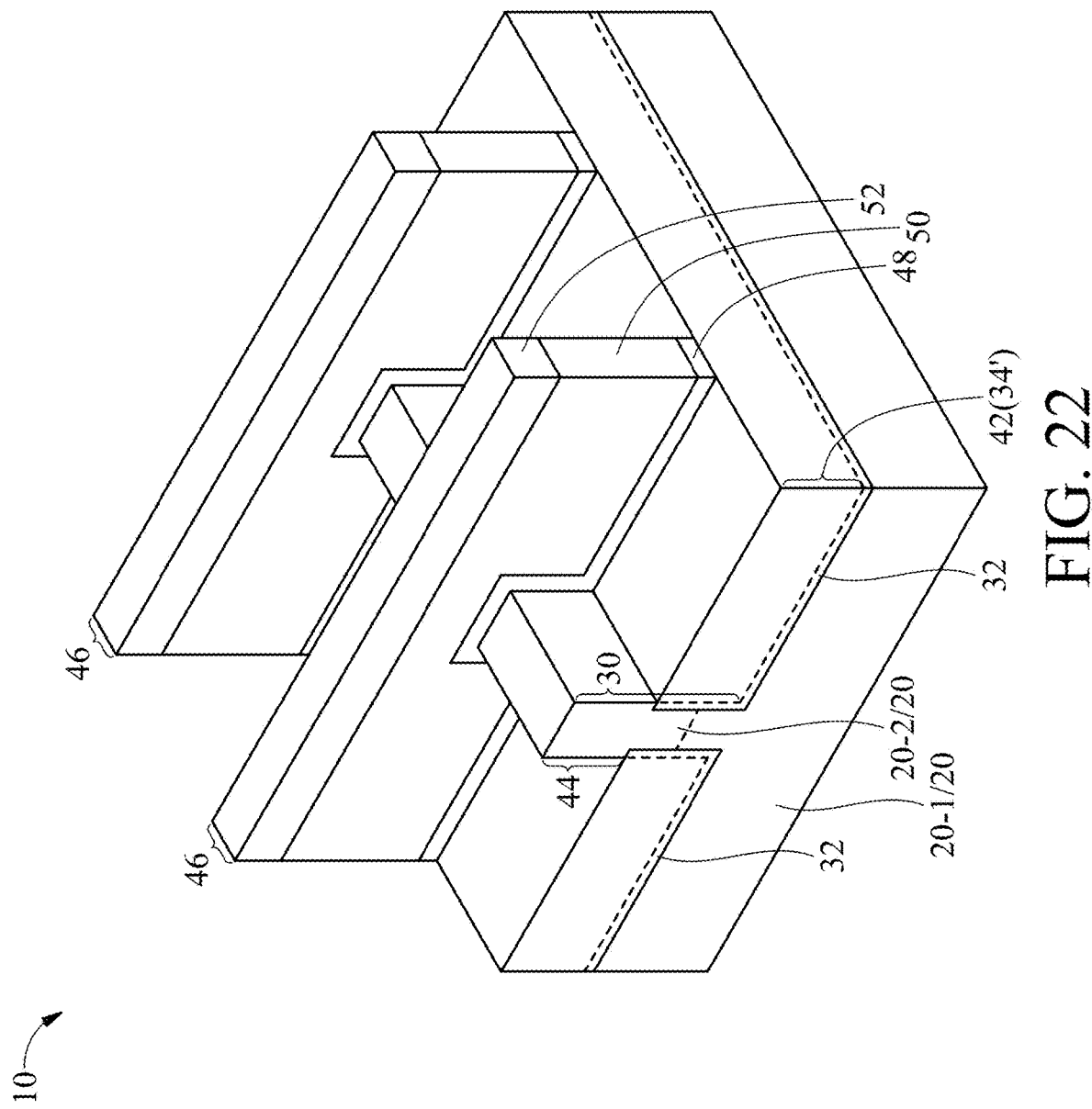

FIGS. 20 through 22 illustrate the perspective views of intermediate stages in the formation of STI regions and a FinFET in accordance with alternative embodiments. These embodiments are similar to the embodiments in the preceding embodiments shown in FIGS. 1, 2, 3A, 3B, 4, 5A, 5B, 6A, 6B, 6C, 7-12, 13A, 13B, and 13C, except that the entire STI regions are formed of dielectric layer 34', and no isolation liner is formed. Unless specified otherwise, the materials and the formation processes of the components in these embodiments are essentially the same as the like components, which are denoted by like reference numerals in the preceding embodiments. The details regarding the formation process and the materials of the components shown in FIGS. 20 through 22 (and FIGS. 23 through 26) may thus be found in the discussion of the preceding embodiments.

The initial steps of these embodiments are essentially the same as shown in FIGS. 1, 2, 3A and 3B, in which a portion of dielectric layer 34 has been formed. The formation is continued until trenches 31 are fully filled with dielectric layer 34. Next, an anneal process (process 214 in FIG. 30) is performed, so that the deposited dielectric layer 34 is converted into silicon oxide layer 34', as shown in FIG. 20. The formation process of silicon oxide layer 34' is essentially the same as discussed in preceding embodiments, and is not repeated herein. Silicon oxide layer 34' fills the entirety of trenches 31 (FIGS. 2, 3A, and 3B). As shown in FIG. 20, top surfaces 34S' of silicon oxide layer 34' is higher than the top surface of hard mask 24. In the formation of silicon oxide layer 34', the low-temperature anneal process may allow water molecules to penetrate deep into dielectric layer 34, and the high-temperature anneal process makes the resulting dielectric layer 34 to expand. Since dielectric layer 34 will fully fill trenches 31 (FIG. 3B), the portions of dielectric layer 34 grown from neighboring semiconductor strips 30 will eventually contact each other, and a seam may form in between. The high-temperature anneal process allows the portions of dielectric layer 34 grown from neighboring protruding semiconductor fins to tightly contact with each other when dielectric layer 34 expands. In the subsequent dry anneal process, cross-linking is established more effectively to cross-link the portions of dielectric layer 34 grown from neighboring protruding semiconductor fins. Accordingly, in the resulting portions of silicon oxide layer 34' in trenches 31, there is substantially no seam and void.

Next, a planarization process is performed on the structure shown in FIG. 20, and STI regions 42 are formed. Accordingly, the entireties of STI regions 42 are formed of silicon oxide layer 34'. STI regions 42 may then be recessed, and the top portions of semiconductor strips 30 form protruding fins 44, as shown in FIG. 21. FIG. 22 illustrates the formation of gate stacks 46. The subsequent processes are essentially the same as what are shown in FIGS. 8-12, 13A, 13B, and 13C, and are not repeated herein. The resulting structure are also similar to what are shown in FIGS. 13A, 13B, and 13C, except that the entire STI regions 42 are formed of a homogeneous silicon oxide 34', with a small amount of carbon therein (for example, lower than about 1 atomic percent).

Figure 23:
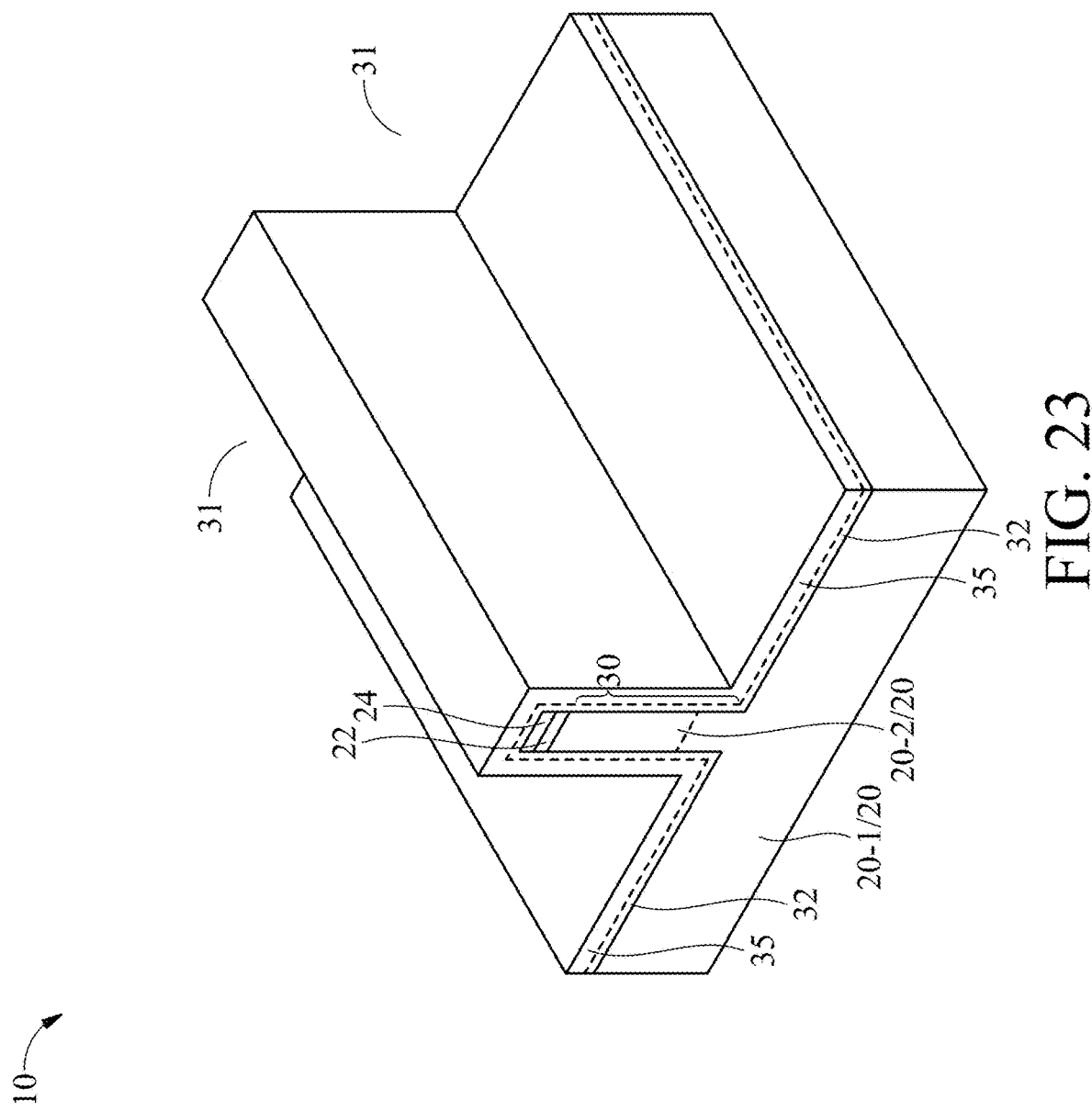
FIGS. 23 through 26 are perspective views of intermediate stages in the formation of STI regions and FinFETs in accordance with some embodiments.

FIGS. 23 through 26 illustrate the perspective views of intermediate stages in the formation of STI regions and a FinFET in accordance with alternative embodiments. These embodiments are similar to the embodiments in the preceding embodiments shown in FIGS. 1, 2, 3A, 3B, 4, 5A, 5B, 6A, 6B, 6C, 7-12, 13A, 13B, and 13C, except that an isolation liner is formed through deposition, and dielectric layer 34' is formed over the isolation liner. The initial steps of these embodiments are essentially the same as shown in FIGS. 1 and 2. Next, as shown in FIG. 23, silicon layer 32 may be (or may not be) formed. Isolation liner 35 is then formed. Isolation liner 35 may be formed of silicon oxide using ALD, CVD, LPCVD, or the like. Isolation liner 35 may be formed as silicon oxide (as deposited) without the processes of converting and annealing. Isolation liner 35 may also be formed of other materials such as silicon nitride.

Figure 24:
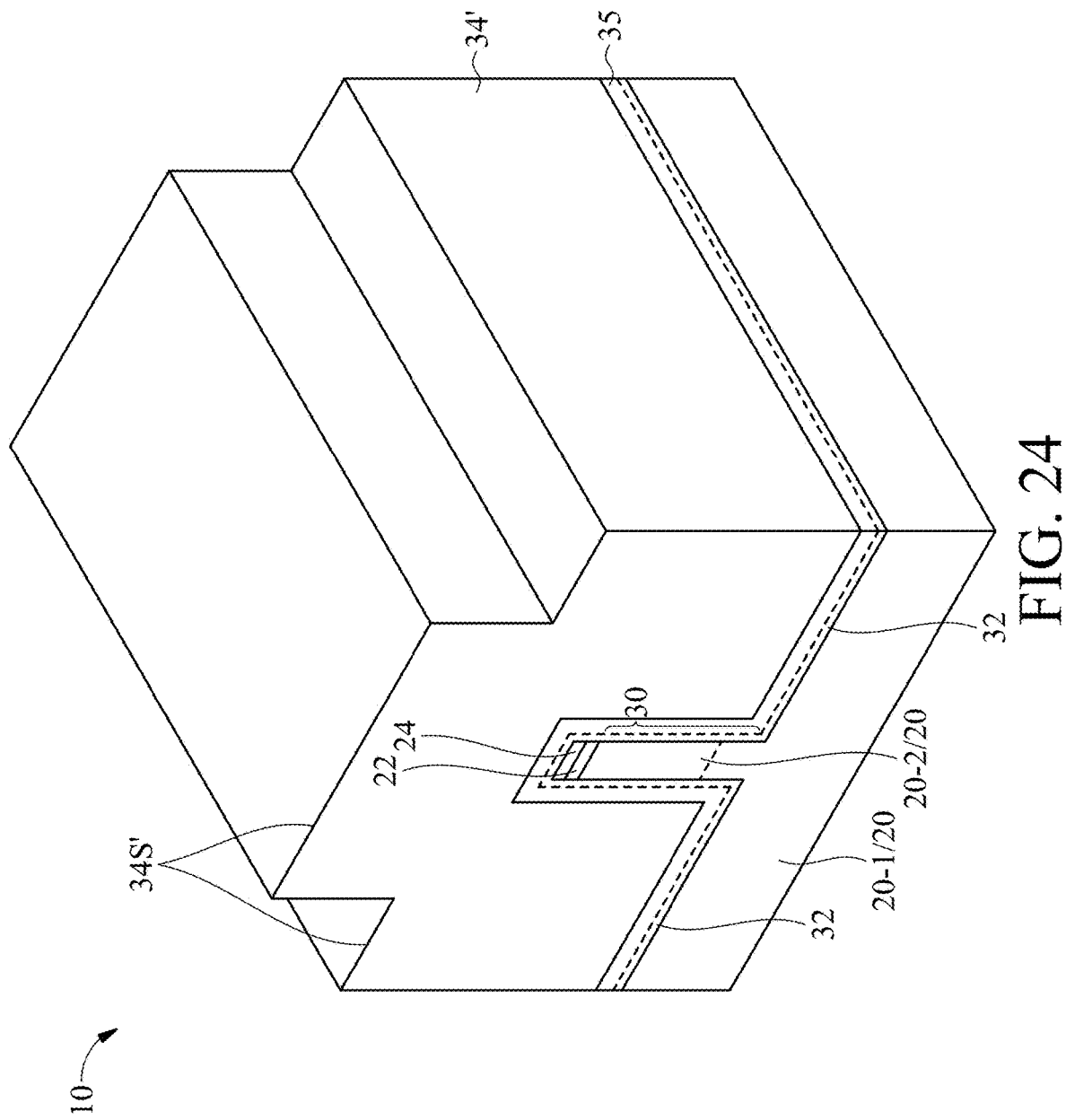

Next, as shown in FIG. 24, silicon oxide layer 34' is formed over isolation liner 35. The formation process is essentially the same as discussed in the preceding embodiments, and is not repeated herein. Silicon oxide layer 34' fills the entirety of the remaining trenches 31 (FIG. 23). As shown in FIG. 24, the top surfaces 34S' of silicon oxide layer 34' are higher than the top surface of hard mask 24. In the formation of silicon oxide layer 34', the low-temperature anneal process may allow water molecules to penetrate into dielectric layer 34, and the high temperature anneal process makes the resulting dielectric layer 34 to expand. This allows the conformal dielectric layer 34 grown from neighboring protruding semiconductor fins to tightly contact with each other, and makes the cross-linking in the subsequent dry anneal process to be more effective. Accordingly, in the resulting STI regions 42, which include silicon oxide layer 34' and isolation liner 35, there is no seam and void.

Figure 25:
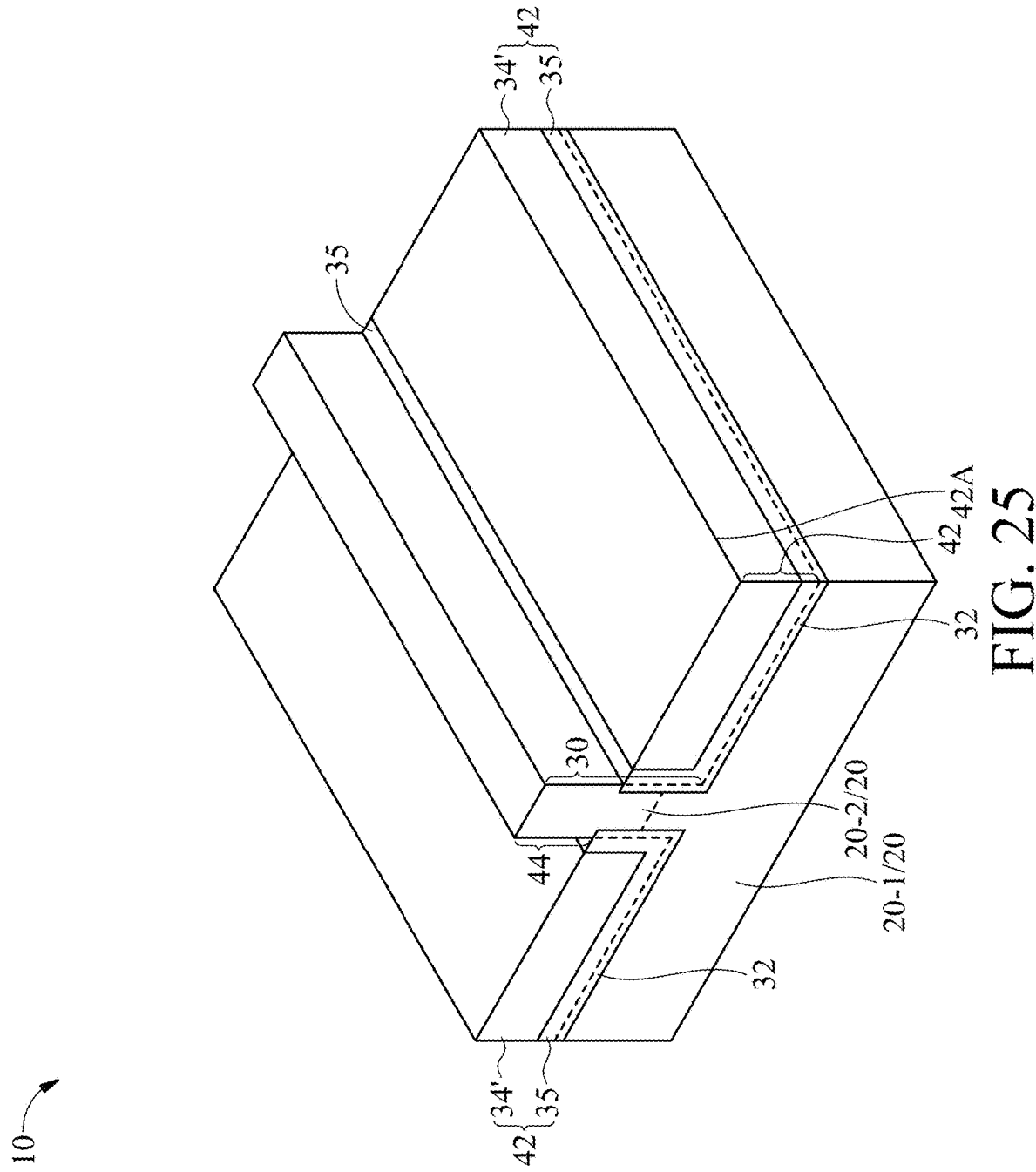
Figure 26:
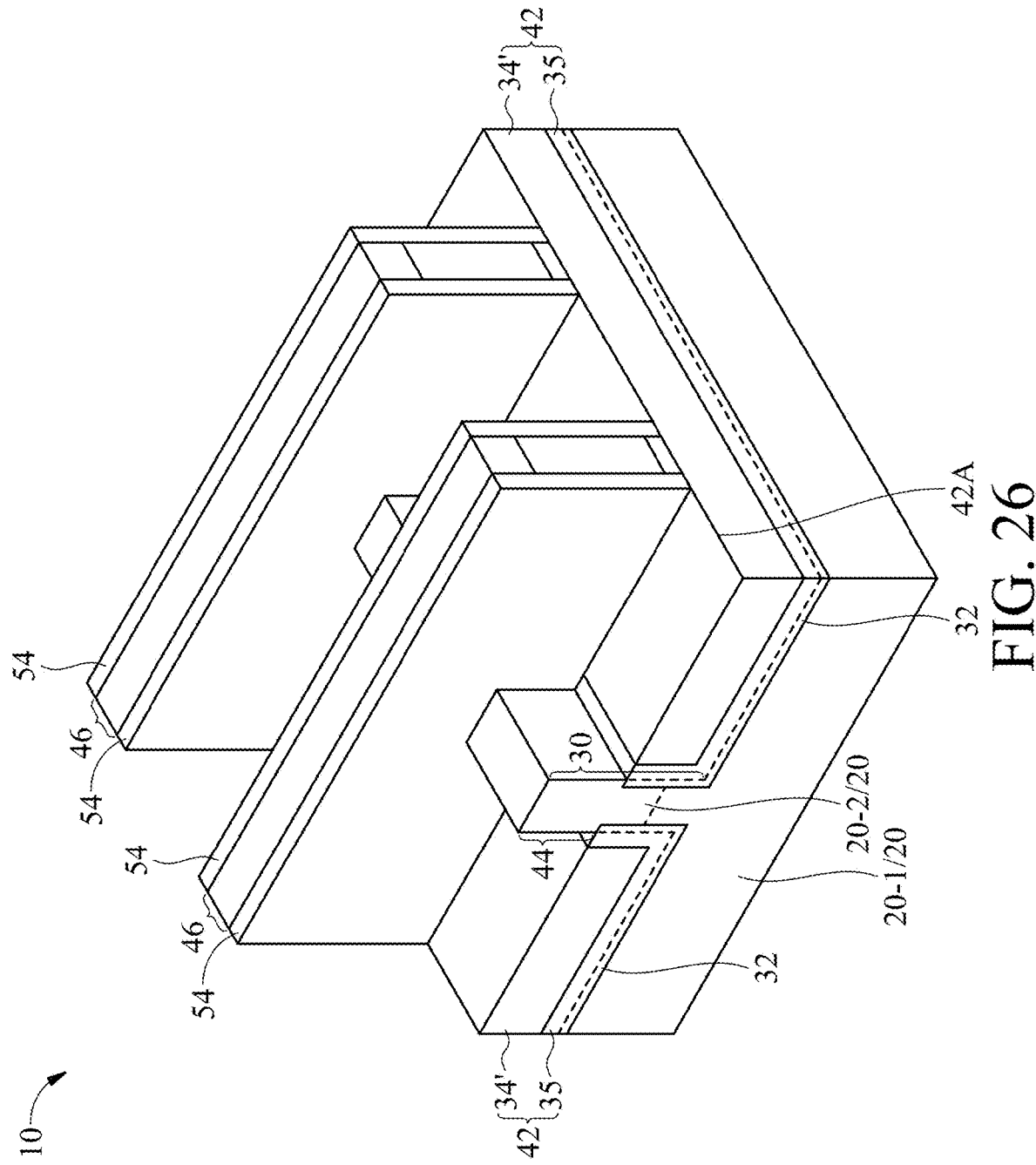

Next, a planarization process is performed on the structure shown in FIG. 24, and STI regions 42 are formed. STI regions 42 may then be recessed, and the top portions of semiconductor strips 30 form protruding fins 44, as shown in FIG. 25. FIG. 26 illustrates the formation of gate stacks 46. The subsequent processes are essentially the same as what are shown in FIGS. 8-12, 13A, 13B, and 13C, and are not repeated herein. The resulting structure are also similar to what are shown in FIGS. 13A, 13B, and 13C, except that STI regions 42 include dielectric isolation liner 35 and the overlying silicon oxide layer 34'. Also, silicon oxide layer 34' may have a small amount of carbon therein (for example, lower than about 1 atomic percent).

Figure 27:
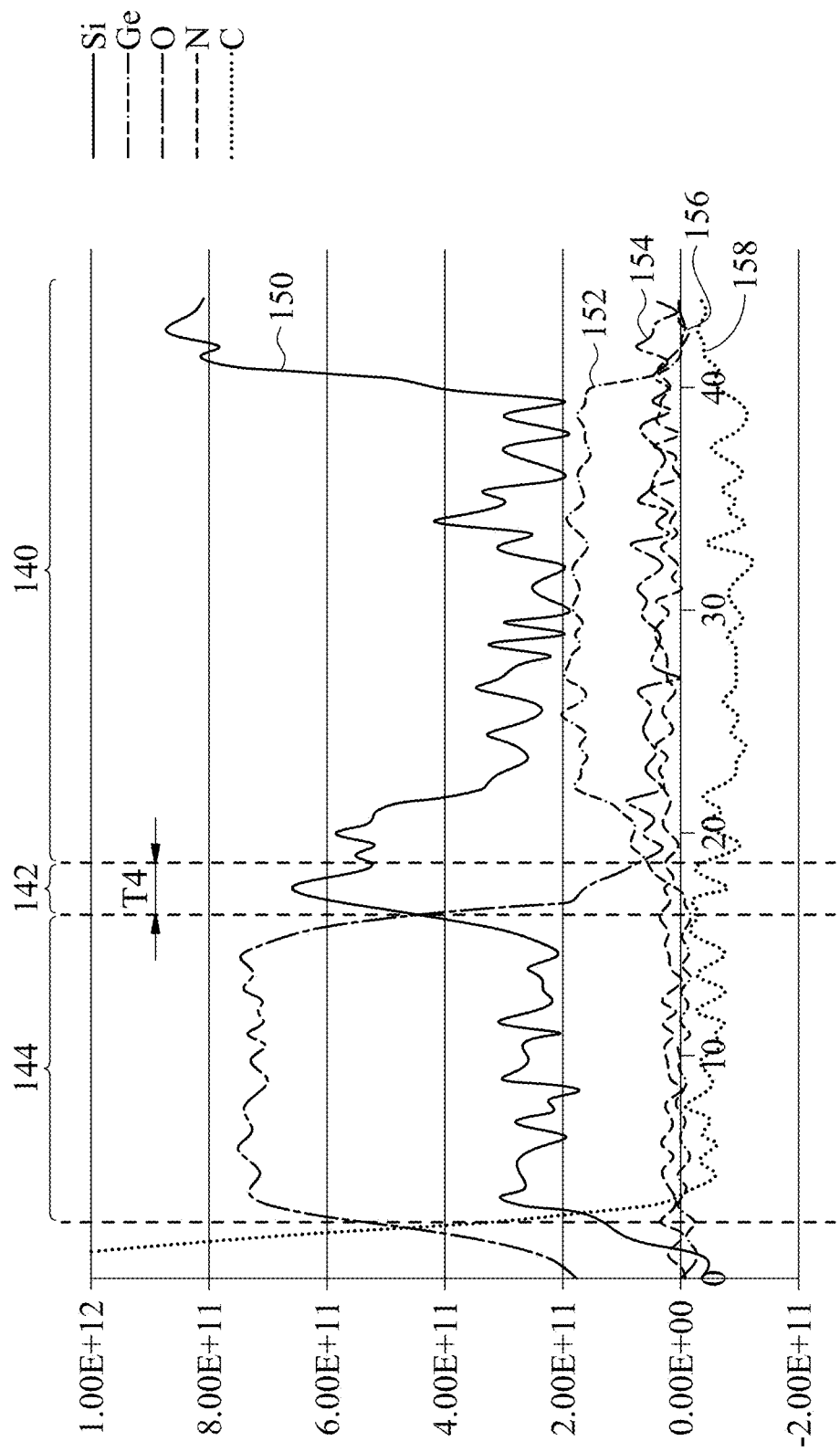
FIGS. 27 through 29 illustrate some experiment results in accordance with some embodiments.
Figure 28:
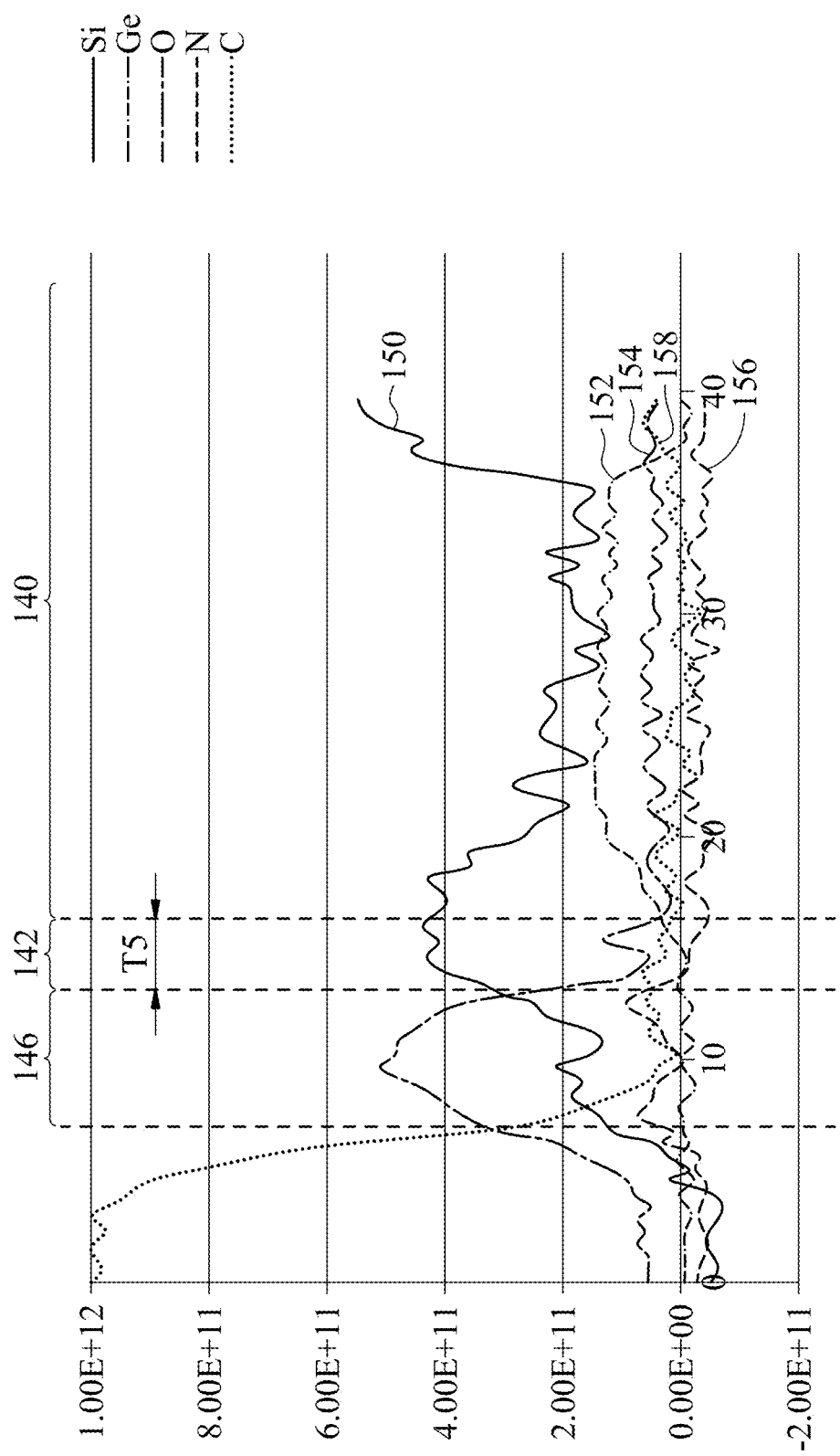
Figure 29:
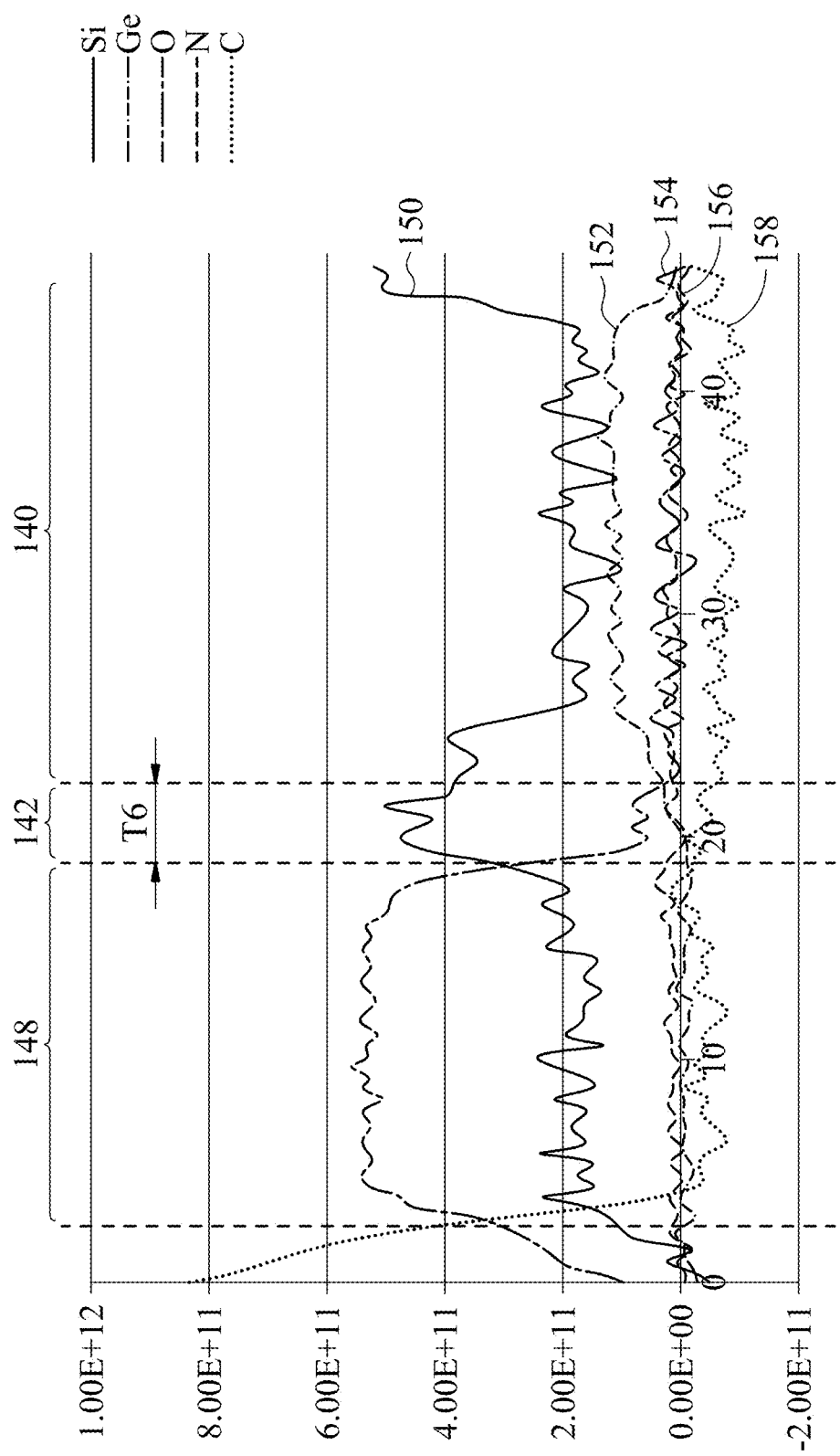

FIGS. 27, 28, and 29 are experiment results obtained from sample wafers, wherein the Y-axis represents the signal strength (amount) of elements Si, Ge, O, N, and C, which are shown by lines 150, 152, 154, 156, and 158, respectively. The X-axis represents different regions in the samples. The samples are measured after the FCVD process and the anneal processes to form dielectric region 40 (FIG. 5B). FIG. 27 illustrates the results obtained from a first sample having a 17 Å silicon layer 32 deposited using LPCVD, and a 30 Å silicon oxide layer formed using conventional LPCVD. The marked regions 140, 142, and 144 correspond to the semiconductor strips 30 (FIG. 3B, for example), silicon layer 32, and the deposited silicon oxide layer, respectively. FIG. 28 illustrates the results obtained from a second sample having a 17 Å silicon layer 32 deposited using LPCVD, and a 30A SiOCN layer 34 formed using processes 206 in FIG. 30 (including ALD cycles but without anneal processes). The marked regions 140, 142, and 146 correspond to semiconductor strips 30 (FIG. 3B, for example), silicon layer 32, and the SiOCN layer 34 (FIG. 3A), respectively. FIG. 29 illustrates the results obtained from a third sample having a 17 Å silicon layer 32 deposited using LPCVD, and a 30 Å silicon oxide layer 34' formed in accordance with some embodiments of the present disclosure (including ALD cycles and anneal processes). The marked regions 140, 142, and 148 correspond to the semiconductor strips 30 (FIG. 3B, for example), silicon layer 32, and the silicon oxide 34', respectively (FIG. 5A). The second sample is obtained after the formation of SiOCN layer 34, and before the anneal processes to convert it into silicon oxide layer 34', while the third sample is obtained after the anneal processes.

The thicknesses of the silicon layers in FIGS. 27, 28, and 29 are marked as T4, T5, and T6, respectively. It is observed that thickness T5 is equal to T6, indicating the thickness of silicon layer 32 is not reduced in the anneal process and the subsequent FCVD. This proves that the SiOCN layer 34 and the converted silicon oxide layer 34' have good oxidation resistance, and can prevent silicon layer 32 and the underlying semiconductor strips 36 (SiGe, for example, FIG. 3B) from being oxidized. As a comparison, thickness T4 (FIG. 27) is smaller than thickness T6, indicating that the oxidation resistance of the silicon oxide layer formed using conventional LPCVD is not as good as layers 34 and 34' of the embodiments of the present disclosure.

The embodiments of the present disclosure have some advantageous features. In the embodiments of the present disclosure, STI regions are formed by forming a SiOCN layer (which is also a SiOCNH layer) and converting the SiOCN layer into a silicon oxide layer. The SiOCN layer and the resulting silicon oxide layer formed in accordance with the embodiments of the present disclosure are dense, and have excellent ability for oxidation resistance. Accordingly, the undesirably oxidation of the semiconductor strips caused by the formation of STI regions may be eliminated or at least reduced.

In accordance with some embodiments of the present disclosure, an integrated circuit structure comprises a bulk semiconductor region; a first semiconductor strip over and connected to the bulk semiconductor region; a dielectric layer comprising silicon oxide, wherein carbon atoms are doped in the silicon oxide, and wherein the dielectric layer comprises: a horizontal portion over and contacting a top surface of the bulk semiconductor region; and a vertical portion connected to an end of the horizontal portion, wherein the vertical portion contacts a sidewall of a lower portion of the first semiconductor strip, wherein a top portion of the first semiconductor strip protrudes higher than a top surface of the vertical portion to form a semiconductor fin, and the horizontal portion and the vertical portion have a same thickness; and a gate stack extending on a sidewall and a top surface of the semiconductor fin. In an embodiment, the integrated circuit structure includes a carbon atom percentage in the dielectric layer is lower than about 1 percent. In an embodiment, the integrated circuit structure includes the dielectric layer further comprises chlorine therein. In an embodiment, the integrated circuit structure further comprises a dielectric region overlapping and contacting the horizontal portion, wherein the dielectric region comprises silicon oxide, and is free from carbon therein. In an embodiment, the integrated circuit structure includes a top portion of the dielectric region protrudes higher than the top surface of the vertical portion to form a dummy dielectric fin, and wherein the gate stack further extends on a sidewall and a top surface of the dummy dielectric fin. In an embodiment, the integrated circuit structure further comprises a second semiconductor strip and a third semiconductor strip over and connected to the bulk semiconductor region; and an isolation region between and contacting both of the second semiconductor strip and the third semiconductor strip, wherein an entirety of the isolation region is formed of a homogenous dielectric material same as the dielectric layer, and wherein the isolation region is free from seams therein.

In accordance with some embodiments of the present disclosure, an integrated circuit structure comprises a bulk semiconductor substrate; and an isolation region over and contacting the bulk semiconductor substrate, wherein the isolation region comprises: a dielectric liner comprising silicon oxide, wherein carbon atoms are doped in the silicon oxide; and a dielectric region filling a region between opposite vertical portions of the dielectric liner, wherein the dielectric region comprises silicon oxide, and is free from carbon therein. In an embodiment, the integrated circuit structure includes the dielectric region further comprises atoms selected from the group consisting of nitrogen atoms, chlorine atoms, and combinations thereof. In an embodiment, the integrated circuit structure further comprises a semiconductor strip having a sidewall contacting a sidewall of the dielectric liner, wherein a top portion of the semiconductor strip protrudes higher than a top surface of the isolation region to form a semiconductor fin. In an embodiment, the integrated circuit structure includes the isolation region further comprises a protruding portion over and joining to the dielectric region, and wherein the protruding portion and the dielectric region are formed of a same dielectric material. In an embodiment, the integrated circuit structure further comprises a semiconductor fin on a side of the isolation region, wherein a top surface of the protruding portion is substantially coplanar with a top surface of the semiconductor fin. In an embodiment, the integrated circuit structure further comprises a contact etch stop layer over and contacting the protruding portion; and an inter-layer dielectric overlapping and contacting the contact etch stop layer.

In accordance with some embodiments of the present disclosure, a method includes etching a semiconductor substrate to form a trench; forming a first dielectric layer through an ALD cycle, wherein the first dielectric layer extends into the trench, and wherein the ALD cycle comprises: pulsing HCD to the semiconductor substrate; purging the HCD; after the purging the HCD, pulsing triethylamine to the semiconductor substrate; and purging the triethylamine; performing an anneal process on the first dielectric layer; and performing a planarization process on the first dielectric layer, wherein a remaining portion of the first dielectric layer forms a portion of an isolation region. In an embodiment, the ALD cycle further comprises: after the triethylamine is purged, pulsing oxygen ($O_2$) to the semiconductor substrate; and purging the oxygen. In an embodiment, the method further comprises repeating the ALD cycle that comprises the pulsing oxygen. In an embodiment, the anneal process comprises: a low-temperature wet anneal process performed at a first temperature; a high-temperature wet anneal process performed at a second temperature higher than the first temperature; and a dry anneal process performed at a third temperature higher than the first temperature. In an embodiment, the method further comprises forming a second dielectric layer over the first dielectric layer, wherein the forming the second dielectric layer is performed using a method different from a method for forming the first dielectric layer. In an embodiment, the forming the second dielectric layer is performed using flowable chemical vapor deposition. In an embodiment, the method further comprises, before the first dielectric layer is deposited, depositing an isolation liner extending into the trench using a method different from a method for forming the first dielectric layer. In an embodiment, the first dielectric layer fills an entirety of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor substrate to form a trench;
   forming a first dielectric layer extending into the trench, wherein the forming the first dielectric layer comprises an Atomic Layer Deposition (ALD) cycle, and wherein the ALD cycle comprises:
   conducting Hexachlorodisilane (HCD) onto the semiconductor substrate; and
   after the HCD is conducted, conducting triethylamine onto the semiconductor substrate; and
   performing an anneal process on the first dielectric layer, wherein the anneal process comprises:
   a dry anneal process;
   a low-temperature wet anneal process at a first temperature; and a high-temperature wet anneal process at a second temperature higher than the first temperature.

2. The method of claim 1, wherein the high-temperature wet anneal process is performed after the low-temperature wet anneal process.

3. The method of claim 1, wherein the dry anneal process is performed at a third temperature higher than the first temperature, and the dry anneal process is performed after the high-temperature wet anneal process.

4. The method of claim 1 further comprising:
depositing a second dielectric layer over the first dielectric layer; and
performing a planarization process on both of the first dielectric layer and the second dielectric layer, wherein remaining portions of the first dielectric layer and the second dielectric layer form a portion of an isolation region.

5. The method of claim 1, wherein the ALD cycle further comprises:
pulsing oxygen ($O_2$) to the first dielectric layer.

6. The method of claim 5 further comprising repeating the ALD cycle that comprises the pulsing the oxygen.

7. The method of claim 1 further comprising, before the first dielectric layer is deposited, depositing a silicon layer extending into the trench.

8. The method of claim 1 further comprising, before the first dielectric layer is deposited, depositing a dielectric liner extending into the trench, wherein the first dielectric layer is over and in physical contact with the dielectric liner.

9. The method of claim 1, wherein the first dielectric layer fills an entirety of the trench.

10. The method of claim 1, wherein the first dielectric layer partially fills the trench.

11. The method of claim 1, wherein the low-temperature wet anneal process and the high-temperature wet anneal process are performed using steam ($H_2O$) as a process gas.

12. A method comprising:
depositing a dielectric layer on a sidewall and over a top surface of a first semiconductor strip, wherein the depositing the dielectric layer comprises a plurality of Atomic Layer Deposition (ALD) cycles, and wherein the dielectric layer comprises SiOCN; and
after the plurality of ALD cycles, performing an anneal process on the dielectric layer, wherein the dielectric layer is converted into a silicon oxide layer by the anneal process, and wherein the anneal process comprises:

a first anneal process to remove nitrogen from the dielectric layer; and
a second anneal process to remove hydrogen introduced into the dielectric layer by the first anneal process.

13. The method of claim 12, wherein the first anneal process comprises a low-temperature anneal process performed at a first temperature, and the second anneal process comprises a dry anneal process performed at a second temperature higher than the first temperature.

14. The method of claim 13 further comprising:
a high-temperature wet anneal process performed at a third temperature higher than the first temperature.

15. The method of claim 14, wherein the high-temperature wet anneal process is performed after the low-temperature anneal process and before the dry anneal process.

16. The method of claim 12 further comprising:
performing a planarization process to remove excess portions of the dielectric layer.

17. The method of claim 12, wherein each of the plurality of ALD cycles comprises:
conducting and purging Hexachlorodisilane (HCD);
conducting and purging triethylamine; and
conducting and purging oxygen ($O_2$).

18. A method comprising:
etching a semiconductor substrate to form a trench;
depositing a first dielectric layer extending into the trench using atomic layer deposition, wherein the first dielectric layer comprises SiOCN;
performing an anneal process to convert the SiOCN in the first dielectric layer into silicon oxide, wherein the anneal process comprises a dry anneal process; and
forming a second dielectric layer over the first dielectric layer, wherein the second dielectric layer extends into the trench.

19. The method of claim 18, wherein the anneal process further comprises:
before the dry anneal process, performing a low-temperature wet anneal process at a first temperature; and
after the low-temperature wet anneal process, performing a high-temperature wet anneal process at a second temperature higher than the first temperature, wherein the dry anneal process is performed at a third temperature higher than the first temperature.

20. The method of claim 18, wherein the depositing the first dielectric layer is performed using Hexachlorodisilane (HCD), triethylamine, and oxygen ($O_2$) as precursors.

* * * * *